US012811591B1

(12) United States Patent
Chakrabarti et al.

(10) Patent No.: US 12,811,591 B1
(45) Date of Patent: Nov. 24, 2026

(54) TARGET DEVICE JOINING SERIAL COMMUNICATION BUS

(71) Applicant: Synopsys, Inc., Sunnyvale, CA (US)

(72) Inventors: Anamitra Chakrabarti, Bangalore (IN); Suresh Venkatachalam, Bangalore (IN)

(73) Assignee: SYNOPSYS, INC., Sunnyvale, CA (US)

( * ) Notice: Subject to any disclaimer, the term of this patent is extended or adjusted under 35 U.S.C. 154(b) by 10 days.

(21) Appl. No.: 19/057,247

(22) Filed: Feb. 19, 2025

(51) Int. Cl.
*H03K 19/17736* (2020.01)
*H03K 3/037* (2006.01)
*H03K 5/135* (2006.01)
*H03K 19/20* (2006.01)
*H03K 23/58* (2006.01)

(52) U.S. Cl.
CPC ......... *H03K 19/1774* (2013.01); *H03K 3/037* (2013.01); *H03K 5/135* (2013.01); *H03K 19/20* (2013.01); *H03K 23/58* (2013.01)

(58) Field of Classification Search
CPC .... H03K 19/1774; H03K 3/037; H03K 5/135; H03K 19/20; H03K 23/58
USPC ............................ 326/37, 38, 39, 40, 41, 93
See application file for complete search history.

(56) References Cited

U.S. PATENT DOCUMENTS

2025/0158617 A1* 5/2025 Cvejanovic ........ H03K 19/1774

OTHER PUBLICATIONS

Cummings, C., et al., "Asynchronous & Synchronous Reset Design Techniques—Part Deux," Synopsys Users Group Conference (SNUG), 2003, Boston, 38 pages.

* cited by examiner

*Primary Examiner* — Arnold M Kinkead

(57) ABSTRACT

An example is a circuit including a reset control circuit. The reset control circuit is configured to be reset by a reset signal asserted on a reset node. The reset control circuit is configured to generate a first gated bus clock signal on a first gated bus clock node. The reset control circuit is configured to activate gating for the first gated bus clock signal when the reset signal is asserted on the reset node. The reset control circuit is configured to deactivate gating for the first gated bus clock signal a duration after the reset signal is de-asserted after being asserted on the reset node.

20 Claims, 11 Drawing Sheets

TARGET DEVICE JOINING SERIAL COMMUNICATION BUS

BACKGROUND

Integrated circuits (ICs) may be fabricated on respective semiconductor dice to implement different functionalities. The ICs may then be attached to or packaged on a same substrate, such as a package substrate, an interposer, or a printed circuit board (PCB). The ICs may then communicate between each other and through the substrate to implement the respective functionalities of the ICs. Where the ICs are fabricated by differing parties, an agreed upon interface implementing a communication protocol or specification may be used by the ICs to communicate between each other. Such interfaces may be or include a multi-bit parallel communication bus or a serial communication bus, for example. In some instances, industry adopted interfaces and protocols or specifications may be implemented to avoid sharing proprietary information between the different parties that fabricate the ICs.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
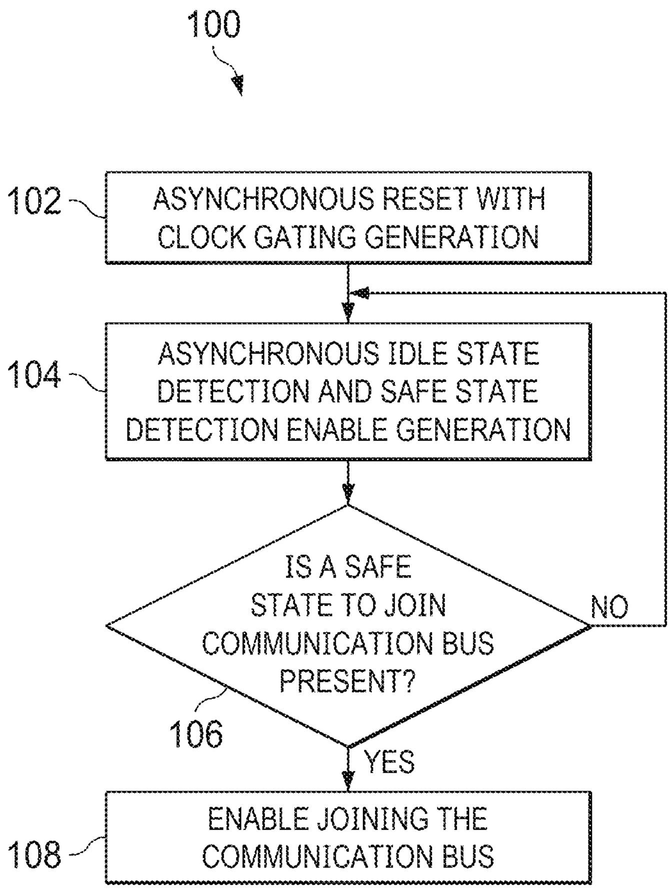
FIG. 1 is a flowchart of a method for enabling a target device to join a communication bus according to some examples.

Aspects of the present disclosure relate to a target device joining a serial communication bus. Proper timing for a target device to join a serial communication bus may pose challenges, particularly when another target device may be using the serial communication bus for communications. If the target device may attempt to join the serial communication bus asynchronously, another target device may be using the serial communication bus for communications, which may cause a fault. The target device should determine a safe time at which to join the serial communication bus before attempting to join.

The Improved Inter-Integrated Circuit (I3C) specification is an example specification for a serial communication bus and is used herein to illustrate challenges of joining a serial communication bus. The I3C specification provides a two-wire serial interface used to communicate between single or multiple I3C target devices and the I3C host controller (e.g., host device). Communication between a host device and a target device is achieved by sharing wires: one wire that carries the clock (SCL) and another wire that carries the serial data (SDA). Normally, a target device operates with the SCL driven intermittently by the host device when performing data transfers. The host device generates the SCL when a transfer is required. The target device may use the SCL as the clock in the target device, and the advantage of using the SCL is to achieve the power efficiency since no high frequency oversampling clock is required to sample the SCL and SDA inputs. The SCL can be used to sample the incoming serial data from the host device and can be used as a standalone interface to integrate low frequency sensors that do not require a high frequency clock.

As per the I3C specification, any I3C target device can attempt to join the I3C bus at any point of time, such as when the I3C bus is idle (e.g., the SCL is not active) or when an ongoing communication is happening on the I3C bus (e.g., the SCL is active) between the host device and another target device in the system. When all the target devices on an I3C bus are initialized along with the host device, the target devices can be asynchronously brought out of reset (e.g., assertion and subsequent de-assertion of a reset without a clock) and be enabled before the host device starts communicating with the target devices in the absence of SCL. If a late joining or hot-join capable target device attempts to join an active I3C bus in the presence of SCL, asynchronous initialization may not work since the de-assertion of the reset and the enabling of the target device is required to be synchronized with the SCL to avoid the flip-flops of the target device from entering a metastability state and thereby experiencing unexpected behavior.

The metastability issue may occur because the reset de-assertion for the target device might not be synchronous to the incoming SCL from the host device. The target device might de-assert a reset when the SCL is active, which can lead to metastability and can cause a catastrophic failure of the target device. The metastability occurs when the reset de-assertion causes a setup time or hold time violation at a flip-flop electrically connected to the flip-flop being reset.

A possible solution to avoid metastability is to use a reset synchronizer that will synchronize the assertion of the reset with the incoming SCL in the target device. The reset synchronizer may eliminate the possibility of an occurrence of metastability. The reset synchronizer, though eliminating the occurrence of metastability, introduces the dependency on the SCL for the target device to come out of reset.

As the SCL is intermittent, the reset synchronizer may effectuate the reset de-assertion when the SCL from the host device is active. This dependency of SCL edges for de-assertion of reset creates a deadlock for a system having a single target device connected to a single host device. As per the I3C specification, in a system having a single target connected to a single host device, the host device can wait for the target device to generate a hot-join interrupt by de-asserting the SDA before generating the SCL. In this case, a deadlock may occur since the target device waits for the SCL to be generated from the host device to come out of reset, and the host device does not generate the SCL until the target device issues an In-Band Interrupt (IBI).

For a system including a single host device and multiple target devices, if the I3C bus is being used to communicate between another target device and the host device, the (local) target device can utilize the SCL from an ongoing transfer and be initialized and enabled before it starts communicating over the I3C bus. In the case when the first transfer from the host device is targeted to a target device that is not initialized, then that target device will not be able to respond as the target device will first use the SCL to become initialized and enabled before it can start decoding the transfers on the I3C bus. This may lead to the target device being un-responsive to the first transfer from the host device if the first transfer is addressed to the target device, and the host device re-attempts the first transfer.

Accordingly, examples described herein provide for a target device joining a serial communication bus, such as an I3C bus. The target device may be reset and come out of reset using an application clock signal of the target device, rather than using a clock signal generated by a host device and that is on the serial communication bus. Further, the target device monitors the serial communication bus to determine whether the serial communication bus is inactive. If the target device determines the serial communication bus to be inactive for a target duration of time, the target device may enable determining whether the target device may safely join the serial communication bus. The target device, when enabled, determines whether a communication on the serial communication bus has occurred and whether that communication indicates that the target device may join the serial communication bus. If determined safe, the target device may join the serial communication bus. Such examples may be implemented in systems including a single host device and a single target device and systems including a single host device and multiple target devices.

Technical advantages of examples described herein include, but are not limited to, the ability of a target device to join a serial communication bus, such as an I3C bus. A target device may be initialized asynchronously from the host device. A target device may be operable to hot-join the serial communication bus, be late joining, and have offline capabilities. Dependency on a clock signal of the serial communication bus (that is generated by the host device) to come out of reset may be avoided, which may avoid a deadlock condition. Further, gating may be implemented that permits the target device to come out of reset before the clock signal from the serial communication bus is used in the target device, which may avoid metastability issues in the target device. The target device may be initialized and enabled at any appropriate time to participate in transfers on the serial communication bus. Also, the target device may, under certain circumstances, be responsive to a first transfer from a host device. Other and/or additional advantages and benefits may be achieved by other examples.

A node of a circuit may be described with a reference name. The node may carry a signal thereon. The signal on the node may follow a same reference name. The presence of a node indicates the presence of a corresponding signal similarly named, and the presence of a signal indicates the presence of a corresponding node similarly named on which is that signal. For example, an application clock node (APP_CLK) has or carries an application clock signal (APP_CLK). Further, various examples may be described and/or illustrated in the context of implementing a particular logic. Different logic circuits, which may use a same logic level convention or a complementary logic level convention as described, may be implemented in other examples. Also, assertion of a signal does not necessarily require a high logic value; rather, a signal may be asserted by a high logic value or a low logic value depending on the logic convention implemented. For convenience herein, although not necessarily in every instance, a signal that is asserted by implementing a low logic value may be appended with "_N", whereas a signal that is asserted by implementing a high logic value may not be appended with an "_N". Conversely, de-assertion of a signal does not necessarily require a low logic value but may be implemented by an opposite or complementary logical value from the logic value of the assertion of that signal.

FIG. 1 is a flowchart of a method 100 for enabling a target device to join a communication bus according to some examples. Although described in the context of an I3C compliant target device and communication bus, the method 100 may be implemented for other devices having same or similar characteristics.

At block 102, the target device is asynchronously reset with clock gating generation. The reset activates gating of a bus clock. In the I3C context, the SCL is gated. The gating of the bus clock may disable the bus clock in the target device during the asynchronous reset. Gating of the bus clock is activated by and during the asynchronous reset of the target device such that metastability of flip-flops in the target device may be avoided. The gating is subsequently deactivated after the target device comes out of reset. Whether gating is activated or deactivated, the clock to which gating is applied when activated is referred to as a gated clock. Further, dependency on the bus clock by the target device for the reset (e.g., for coming out of reset) is also avoided. Avoiding this dependency on the bus clock may avoid a deadlock scenario.

At block 104, the target device performs asynchronous idle state detection and safe state detection enable generation. The idle state detection detects an idle state of the communication bus for an appropriate period. Thereafter, in response to an idle state being detected, the safe state detection enable generation is performed, which causes the target device to attempt to properly decode incoming communications from the communication bus for identifying a safe state to join the bus. Monitoring the communication bus may be performed using a counter that is configured to count a longest inactive period of the bus clock for bus communications that should not be identified as an idle state of the communication bus.

At block 106, following the asynchronous idle state detection and safe state detection enable generation of block 104, the target device monitors the communication bus to determine a safe state for the target device to join the communication bus. The target device may monitor the gated bus clock and a gated bus data line (e.g., with gating activated and deactivated like with the gated bus clock) to determine whether a start condition or a stop condition is detected. A start or stop condition may be detected from the communication bus within a safe duration following the safe state detection enable generation of block 104. If a start or stop condition is detected within the safe duration, a safe state is determined to be present at block 106, and hence, at block 108, the target device is enabled to join the communication bus. The detected start or stop condition indicates to the target device that the target device may join the communication bus, e.g., by issuing an IBI to the host device.

If a start or stop condition is not detected within the safe duration following the safe state detection enable generation, a safe state is not present as determined at block 106, and the method 100 loops back to the asynchronous idle state detection and safe state detection enable generation of block 104. The determination of a safe state at block 106 may be disabled during and until after the idle state detection and safe state detection enable generation of block 104 is performed.

In some implementations, a delay from generation of the safe state detection enable to a beginning of the safe duration may result in a start or stop condition occurring before the beginning of the safe duration. This may cause the start or stop condition to not be detected within the safe duration. Assuming a subsequent start or stop condition is not detected within the safe duration, the method 100 looping back to the asynchronous idle state detection and safe state detection enable generation of block 104 permits the target device to determine a subsequent safe state in which to join the communication bus. Generally, while the target device is being enabled, a host device can start communicating with the target device that is becoming initialized. In this case, the target device might miss the first few bits of the first communication and fail to decode the incoming first communication. By looping back to block 104, the target device waits for an appropriate time before driving the communication bus in a safe manner.

Figure 2:
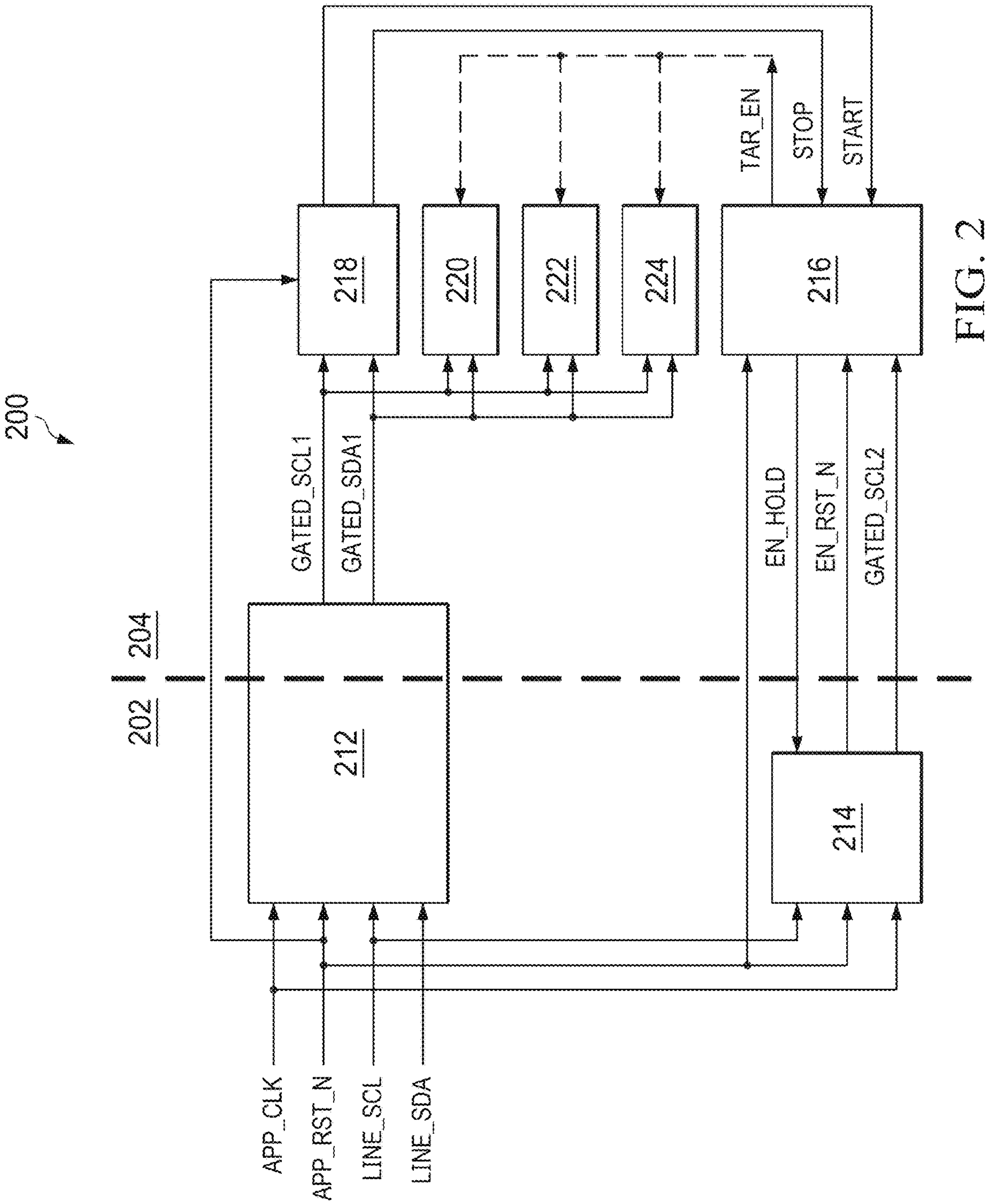
FIG. 2 is a diagram of a bus-state detection circuit of a target device according to some examples.

FIG. 2 is a diagram of a target device circuit 200 of a target device according to some examples. In the illustrated example, the target device circuit 200 includes an application circuit 202 and a communication circuit 204. The application circuit 202 may include circuitry for any application that communicates with another device through the communication circuit 204 and a communication bus communicatively connected to the communication circuit 204. The communication circuit 204 includes any circuitry that is configured to process, encode, decode, etc. communications on the communication bus. For example, the communication circuit 204, in addition to other circuits described subsequently, may include a receive circuit 220 configured to accept target address and data from the host device, a transmit circuit 222 configured to send data to the host device, and a status circuit 224 configured to monitor the status of a transfer on the bus. A division between the application circuit 202 and the communication circuit 204 may be arbitrary or may be omitted.

The target device circuit 200 includes a reset control circuit 212, an idle state detection circuit 214, a safe state detection circuit 216, and a bus monitor circuit 218. As illustrated, the reset control circuit 212 is in and across the application circuit 202 and the communication circuit 204; the idle state detection circuit 214 is in the application circuit 202; the safe state detection circuit 216 is in the communication circuit 204; and the bus monitor circuit 218, receive circuit 220, transmit circuit 222, and status circuit 224 are in the communication circuit 204. The reset control circuit 212, idle state detection circuit 214, safe state detection circuit 216, and bus monitor circuit 218 may be in different parts of the application circuit 202 and/or the communication circuit 204.

Respective input nodes of the reset control circuit 212 are electrically connected to an application clock node (APP_CLK), an application reset node (APP_RST_N), a bus lineside clock node (LINE_SCL), and a bus lineside data node (LINE_SDA). The APP_CLK is a node of the application circuit 202 that carries an application clock signal, which may be generated by the application circuit 202. The APP_RST_N is a node of the application circuit 202 that carries a reset signal generated by the application circuit 202. The LINE_SCL is a node of the communication bus that carries a clock signal of the communication bus, which may be generated by a host device communicatively connected to the communication bus. The LINE_SDA is a node of the communication bus that carries a data signal of the communication bus, which may be generated by the host device or a target device communicatively connected to the communication bus. Respective output nodes of the reset control circuit 212 are or are electrically connected to a first gated bus lineside clock node (GATED_SCL1) and a first gated bus lineside data node (GATED_SDA1). The reset control circuit 212 gates the LINE_SCL and LINE_SDA to generate respective signals on the GATED_SCL1 and GATED_SDA1. Generally, upon assertion of the APP_RST_N, the reset control circuit 212 is reset (e.g., flip-flops (FFs) of the reset control circuit 212), which activates the gating of the GATED_SCL1 and GATED_SDA1. After the reset control circuit 212 comes out of reset, the gating of the GATED_SCL1 and GATED_SDA1 is deactivated following a set duration (e.g., a delay duration corresponding to propagation through FFs) following de-assertion of the APP_RST_N.

Respective input nodes of the idle state detection circuit 214 are electrically connected to the APP_CLK, the APP_RST_N, the LINE_SCL, and an enable hold node (EN_HOLD). Respective output nodes of the idle state detection circuit 214 are or are electrically connected to a second gated bus lineside clock node (GATED_SCL2) and an enable/reset node (EN_RST_N). The idle state detection circuit 214 may be asynchronously reset upon assertion of the APP_RST_N. The idle state detection circuit 214 gates the LINE_SCL to generate a signal on the GATED_SCL2. The idle state detection circuit 214 asserts the EN_RST_N after detecting an idle state of the LINE_SCL. While the idle state detection circuit 214 detects an idle state (e.g., is enabled to detect an idle state), the idle state detection circuit 214 activates gating for the GATED_SCL2. The EN_HOLD is a node of the safe state detection circuit 216 that carries an enable signal latched in the safe state detection circuit 216, which may be based on the EN_RST_N. Assertion of the EN_HOLD disables detection of an idle state of the LINE_SCL and deactivates gating for the GATED_SCL2.

Respective input nodes of the bus monitor circuit 218 are electrically connected to the APP_RST_N, the GATED_SCL1, and the GATED_SDA1. Respective output nodes of the bus monitor circuit 218 are or are electrically connected to a stop condition detection node (STOP) and a start condition detection node (START). The bus monitor circuit 218 may be asynchronously reset upon assertion of the APP_RST_N. The bus monitor circuit 218 is configured to monitor the GATED_SCL1 and GATED_SDA1 to detect a start condition and a stop condition. When the bus monitor circuit 218 detects a start condition, the bus monitor circuit 218 is configured to assert the START, which indicates that the STOP is not asserted (e.g., since the START and STOP are not simultaneously asserted together). When the bus monitor circuit 218 detects a stop condition, the bus monitor circuit 218 is configured to assert the STOP, which indicates that the START is not asserted. In the absence of detection of a start condition or a stop condition, the bus monitor circuit 218 is configured to not assert or de-assert the START and the STOP. Other circuits in the communication circuit 204 (e.g., the receive circuit 220, transmit circuit 222, and/or status circuit 224) may be electrically connected to the GATED_SCL1 and GATED_SDA1.

Respective input nodes of the safe state detection circuit 216 are electrically connected to the APP_RST_N, the EN_RST_N, the GATED_SCL2, the STOP, and the START.

Respective output nodes of the safe state detection circuit 216 are or are electrically connected to the EN_HOLD and a target join enable node (TAR_EN). The safe state detection circuit 216 may be asynchronously reset upon assertion of the APP_RST_N. The safe state detection circuit 216 is configured to assert the TAR_EN following an idle state of the LINE_SCL being detected and upon assertion of the START or STOP during a safe duration. In such situation, a start or stop condition on the communication bus has been detected after an appropriate idle period, and the target device may join the communication bus, which is enabled by the assertion of the TAR_EN. As illustrated, the TAR_EN is electrically connected to other circuits in the communication circuit 204 (e.g., the receive circuit 220, transmit circuit 222, and/or status circuit 224).

The safe state detection circuit 216 latches an assertion of the EN_HOLD when the EN_RST_N is asserted. The EN_HOLD being asserted triggers a beginning of a safe duration of activity by the GATED_SCL2 in which whether the START or STOP is asserted is determined. As indicated subsequently in an example, the safe duration may be determined by a counter that counts based on activity of the GATED_SCL2. If the safe state detection circuit 216 determines that neither the START nor the STOP is asserted during the safe duration, it may be assumed that a continued communication is occurring on the communication bus, and joining the communication bus by the target device is not safe. Rather, the target device should delay joining the communication bus. If the safe state detection circuit 216 determines that the START or the STOP is asserted during the safe duration, it may be assumed that joining the communication bus by the target device is safe, and the safe state detection circuit 216 asserts the TAR_EN. The assertion of the TAR_EN may enable other circuits in the communication circuit 204 (e.g., the receive circuit 220, transmit circuit 222, and/or status circuit 224) such that the target device joins the communication bus. Further, the safe state detection circuit 216 is configured to de-assert the EN_HOLD at the conclusion of the period when neither a start condition nor a stop condition was detected, which enables detection of an idle state of the LINE_SCL and activates gating for the GATED_SCL2 in the idle state detection circuit 214.

Figure 3:
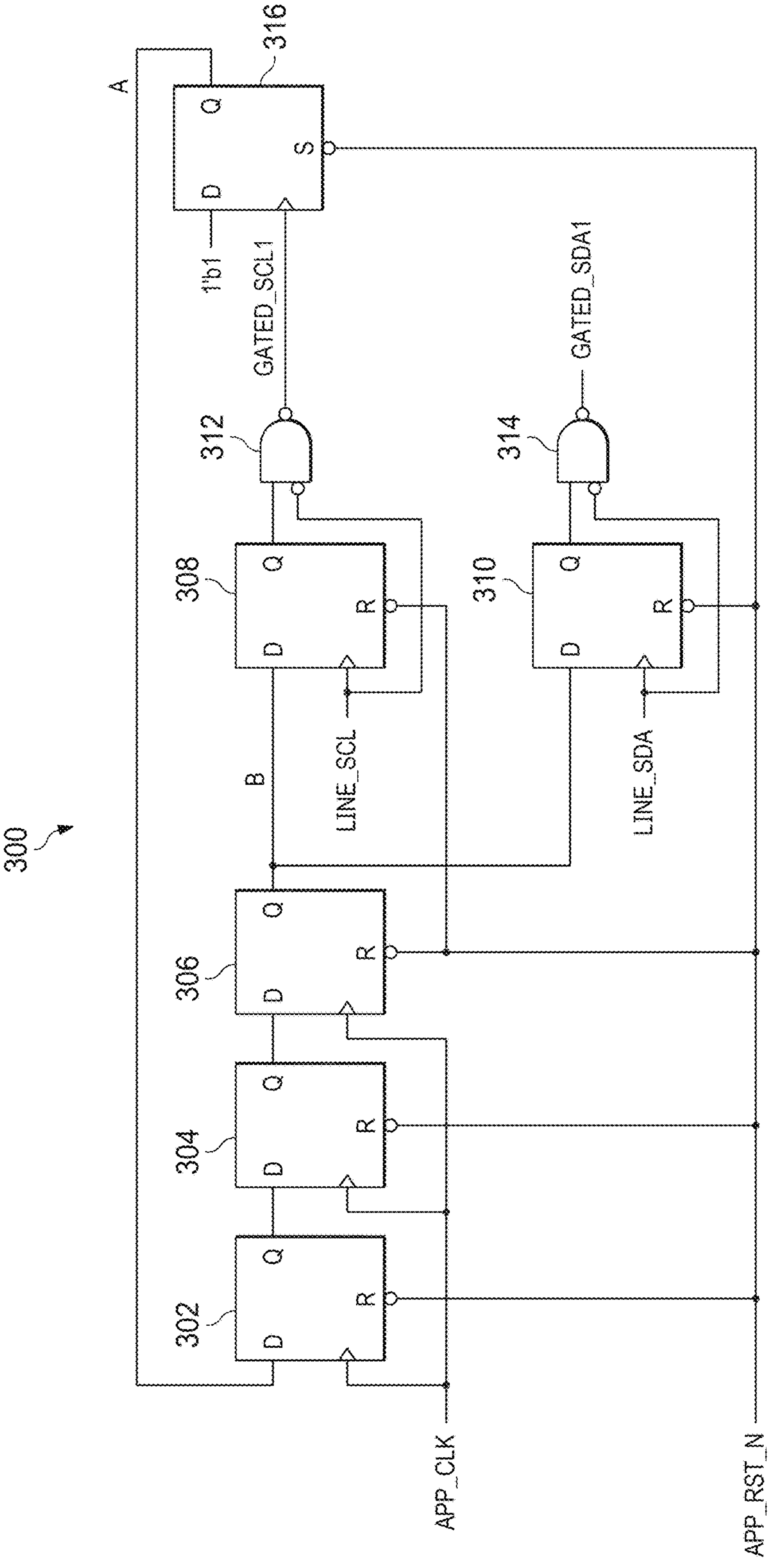
FIG. 3 is a circuit schematic of a reset control circuit according to some examples.

FIG. 3 is a circuit schematic of a reset control circuit 300 according to some examples. The reset control circuit 300 includes FFs 302, 304, 306, 308, 310, 316 and NAND gates 312, 314. The FFs 302-310 are configured to be reset by the assertion of a reset signal (e.g., APP_RST_N) such that a respective output (Q) node is logically low (e.g., a logical '0'), and the FF 316 is configured to be set by the assertion of a set signal (e.g., APP_RST_N) such that the output (Q) node is logically high (e.g., a logical '1'). The FFs 302-310, 316 may be D FFs with asynchronous set-reset.

An output (Q) node of the FF 302 is electrically connected to an input (D) node of the FF 304, and an output (Q) node of the FF 304 is electrically connected to an input (D) node of the FF 306. An output (Q) node of the FF 306 is electrically connected to respective input (D) nodes of the FFs 308, 310. An output (Q) node of the FF 308 is electrically connected to a first input node (e.g., a non-inverting input node) of the NAND gate 312, and an output (Q) node of the FF 310 is electrically connected to a first input node (e.g., a non-inverting input node) of the NAND gate 314. The LINE_SCL is electrically connected to a clock input node of the FF 308 and to a second input node (e.g., an inverting input node) of the NAND gate 312, and the LINE_SDA is electrically connected to a clock input node of the FF 310 and to a second input node (e.g., an inverting input node) of the NAND gate 314. An output node of the NAND gate 312 is the GATED_SCL1, and an output node of the NAND gate 314 is the GATED_SDA1. An input (D) node of the FF 316 is electrically connected to a logically high node (e.g., to a positive power supply node (VDD)). A clock input node of the FF 316 is electrically connected to the GATED_SCL1. An output (Q) node of the FF 316 is electrically connected to an input (D) node of the FF 302. For convenience subsequently, the output (Q) node of the FF 316 is a reference node (A), and the output (Q) node of the FF 306 is a gating activation node (B).

Respective clock input nodes of the FFs 302, 304, 306 are electrically connected to the APP_CLK, and respective inverting reset input nodes of the FFs 302, 304, 306, 308, 310 are electrically connected to the APP_RST_N. An inverting set input node of the FF 316 is electrically connected to the APP_RST_N.

Other FFs (not shown) in the communication circuit 204 may have reset input nodes (e.g., inverting or non-inverting reset input nodes) that are electrically connected to the APP_RST_N. Hence, such FFs may be reset by the assertion of APP_RST_N. Further, FFs in the communication circuit 204 may have input (D) nodes and/or clock input nodes electrically connected to the GATED_SDA1 and/or GATED_SCL1.

Figure 4:
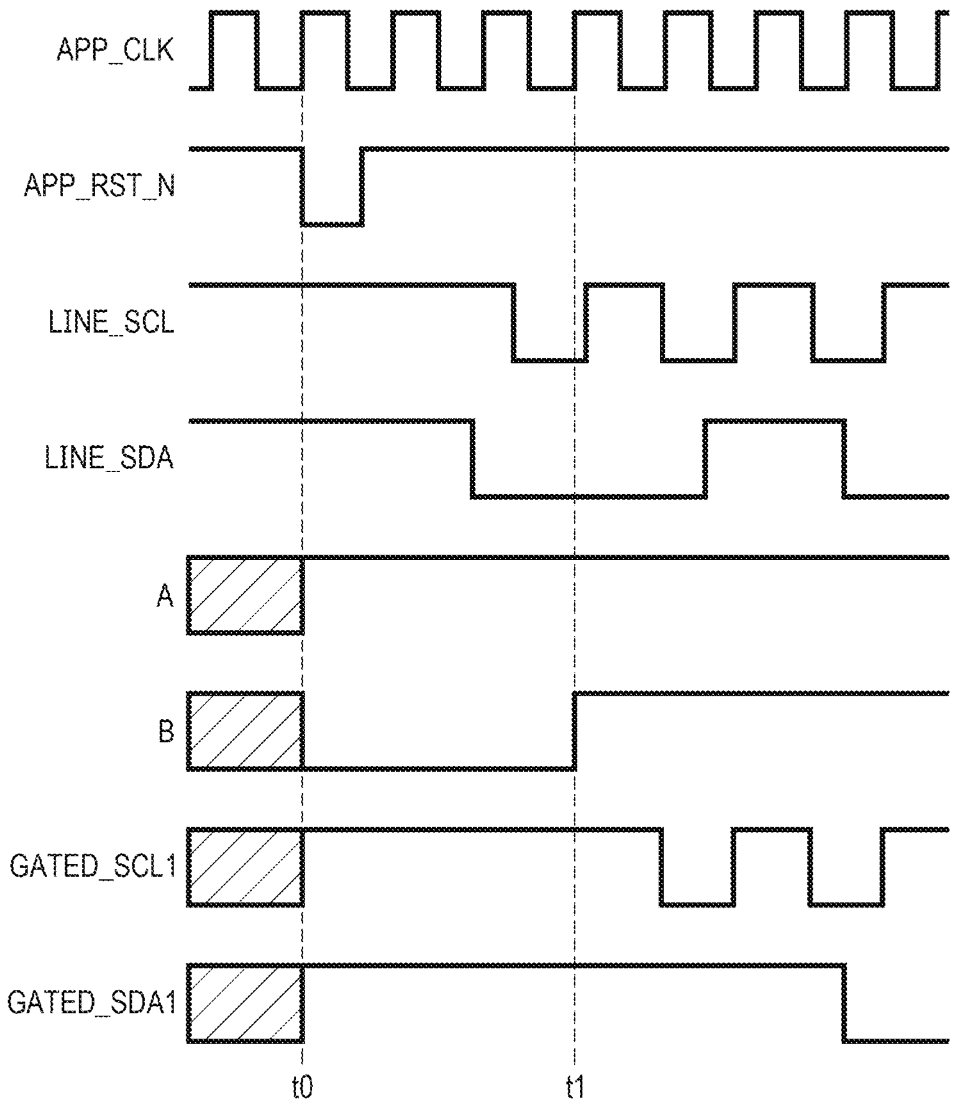
FIGS. 4 and 5 are timing diagrams of example signals of the reset control circuit of FIG. 3 according to some examples.
Figure 5:
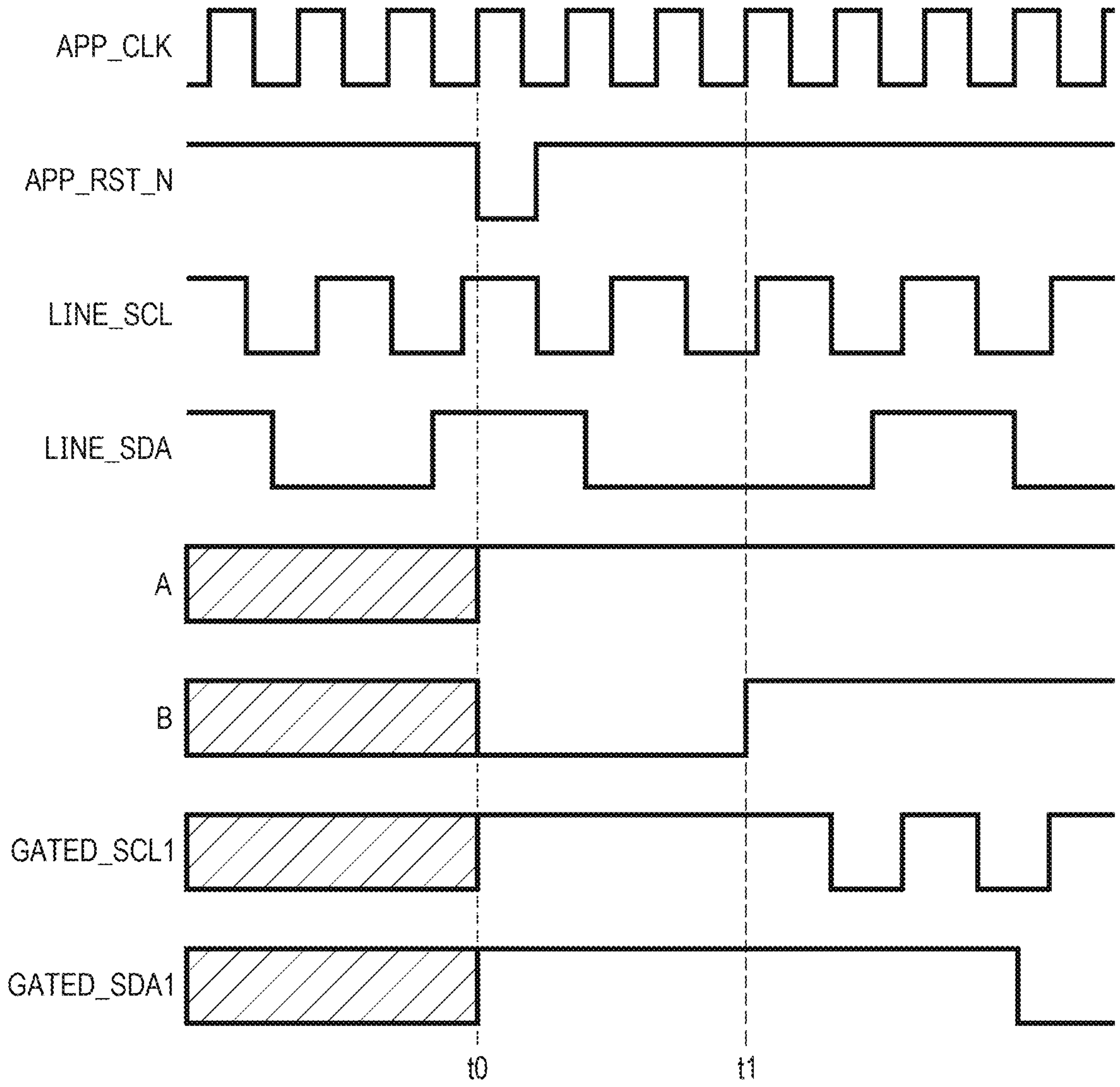

FIGS. 4 and 5 are timing diagrams of example signals of the reset control circuit 300 of FIG. 3 according to some examples. In FIG. 4, the APP_RST_N is asserted at time to when the LINE_SCL and LINE_SDA are idle, and in FIG. 5, the APP_RST_N is asserted at time t0 when the LINE_SCL and LINE_SDA are active (e.g., transferring a communication). Referring to both FIG. 4 and FIG. 5, the APP_RST_N is asserted (e.g., pulled to a logical low or logical '0') at time to. Prior to the assertion of APP_RST_N at time to, the logical value (e.g., voltage) of the A and B may be nondeterministic. With the assertion of the APP_RST_N at time t0, the FF 316 is set to a logical high (e.g., logical '1'), and the FFs 302-310 are reset to a logical low (e.g., logical '0'). Hence, the A is logically high at time t0, and the B is logically low at time t0. The APP_RST_N is de-asserted (e.g., transitions to a logical high or logical '1') within one cycle of the APP_CLK following the assertion of the APP_RST_N. The logically high value on the A is then propagated through the FFs 302, 304, 306 through the next three rising edges of cycles of the APP_CLK following the de-assertion of the APP_RST_N such that B transitions from logically low to logically high at time t1 (e.g., three cycles of APP_CLK after time t0).

Between time t0 and time t1, the B is logically low and is asserted to activate gating. If between time t0 and time t1 the LINE_SCL and LINE_SDA become or are active as shown in FIGS. 4 and 5, the logical low value of the B is propagated to the NAND gates 312, 314, which causes the GATED_SCL1 and GATED_SDA1 to be logically high. Hence, when B is logically low, gating in the reset control circuit 300 is activated, and the GATED_SCL1 and GATED_SDA1 are logically high, as shown between time t0 and time t1.

If following the assertion of the APP_RST_N at time to the LINE_SCL and LINE_SDA remain inactive, the logical low values of the output (Q) nodes of the FFs 308, 310 remain from the assertion of the APP_RST_N (e.g., even after the B becomes logically high), which causes GATED_SCL1 and GATED_SDA1 to be logically high. Once B is logically high and the LINE_SCL and LINE_SDA are active (e.g., have a respective rising edge), the GATED_SCL1 and GATED_SDA1 are the LINE_SCL and LINE_SDA, respectively. When B becomes logically high at time t1 and the LINE_SCL and LINE_SDA become active, the logical high value of B propagates through the FFs 308, 310 to the NAND gates 312, 314 at the next rising edge of the LINE_SCL and LINE_SDA, respectively, which deactivates the gating such that the LINE_SCL and LINE_SDA are output from the NAND gates 312, 314 as the GATED_SCL1 and GATED_SDA1, respectively.

The LINE_SCL and APP_CLK may be asynchronous with respect to each other. Hence, the assertion of the APP_RST_N may be asynchronous to the LINE_SCL. Further, the LINE_SCL may be intermittent in nature, which may permit the LINE_SCL and/or LINE_SDA to be active or idle at the time of assertion and/or de-assertion of the APP_RST_N. Without gating the LINE_SCL and LINE_SDA, FFs in the communication circuit 204 that would rely on or are electrically connected to the LINE_SCL and/or LINE_SDA and are reset based on the APP_RST_N may experience set up or hold time violations when the APP_RST_N is de-asserted due to the asynchronous nature of the APP_RST_N to the LINE_SCL and LINE_SDA. These set up or hold time violations may result in those FFs entering metastability.

However, using the reset control circuit 300 of FIG. 3, FFs in the communication circuit 204 may rely on or be electrically connected to the GATED_SCL1 and/or GATED_SDA1 and may be reset based on the APP_RST_N. Hence, the application circuit 202 may assert the APP_RST_N to reset FFs in the communication circuit 204 and subsequently de-assert the APP_RST_N where the LINE_SCL and LINE_SDA are gated to generate the GATED_SCL1 and GATED_SDA1, respectively, until some amount of time after the de-assertion of the APP_RST_N. This permits the FFs of the communication circuit 204 to come out of a reset state with sufficient time before the gating of the LINE_SCL and LINE_SDA is deactivated (e.g., when the GATED_SCL1 and GATED_SDA1 are the LINE_SCL and LINE_SDA, respectively) to prevent a set up or hold time violation. As indicated by FIGS. 4 and 5, the assertion of the APP_RST_N at time to activates gating of the LINE_SCL and LINE_SDA by the B being logically low between time to and time t1, which provides sufficient time following the de-assertion of APP_RST_N to avoid set up or hold time violations of FFs reset by the APP_RST_N and having the GATED_SCL1 and/or GATED_SDA1 as an input. The gating of the LINE_SCL and LINE_SDA ensures that there is no LINE_SCL and LINE_SDA present when reset of FFs is asserted or removed. As there is no clock present at the FFs, the violation of setup and hold time does not occur, and the reset assertion and de-assertion may occur asynchronously.

Using the reset control circuit 300 of FIG. 3, dependency on the LINE_SCL and/or LINE_SDA by FFs in the communication circuit 204 may be avoided, and a reset synchronizer circuit to synchronize a reset to the LINE_SCL and/or LINE_SDA for resetting FFs may also be avoided. Further, since FFs in the communication circuit 204 may be reset using the reset control circuit 300 when the LINE_SCL and LINE_SDA are active or idle, as shown in FIGS. 4 and 5, the target device may be reset (e.g., come out of a hibernation mode) and participate in the communication bus traffic at any time.

Figure 6:
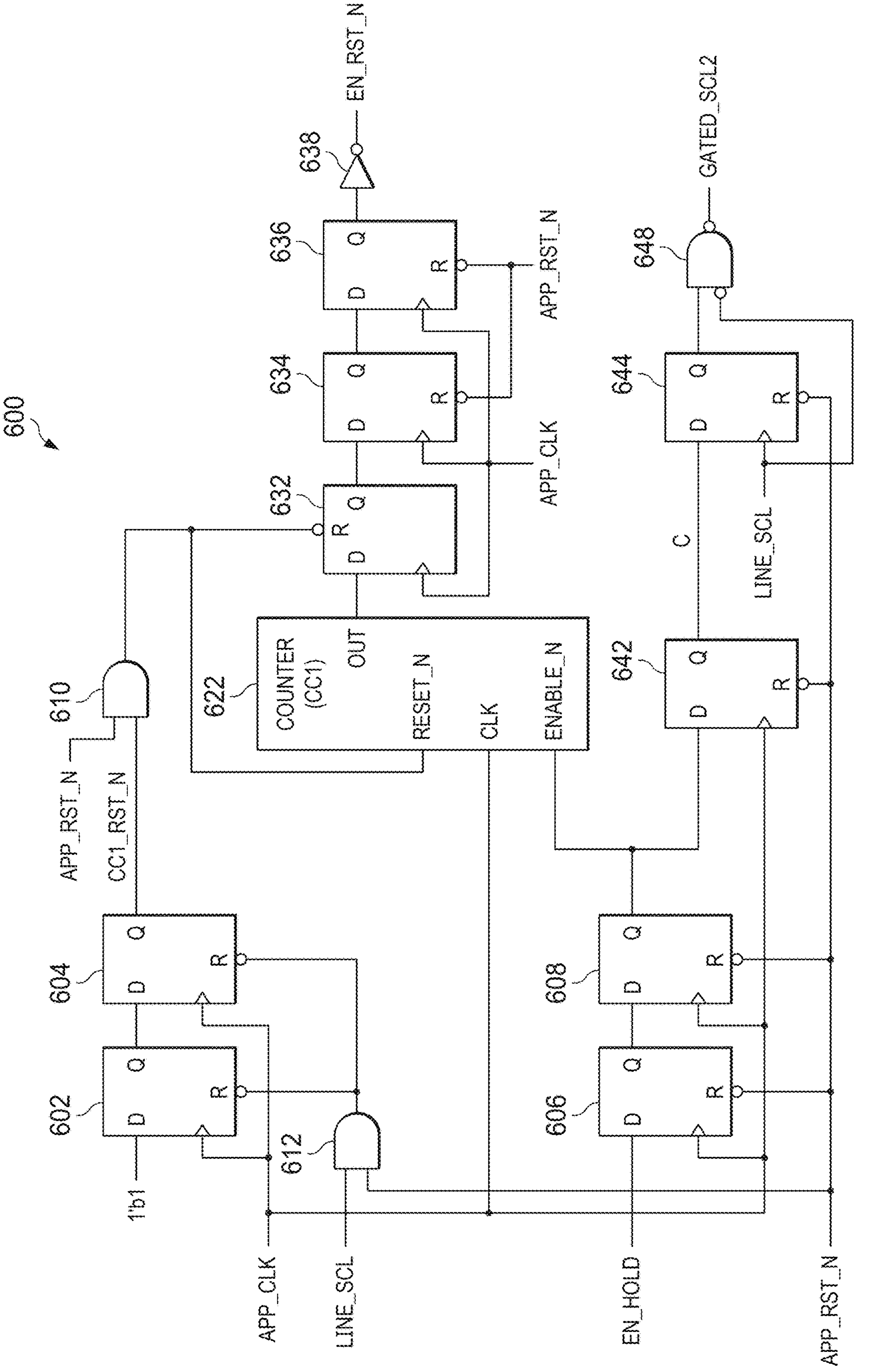
FIG. 6 is a circuit schematic of an idle state detection circuit according to some examples.

FIG. 6 is a circuit schematic of an idle state detection circuit 600 according to some examples. The idle state detection circuit 600 includes FFs 602, 604, 606, 608, 632, 634, 636, 642, 644, AND gates 610, 612, a first counter (CC1) 622, an inverter 638, and a NAND gate 648. The FFs 602-608, 632-636, 642, 644 are configured to be reset by assertion of a reset signal such that a respective output (Q) node is logically low (e.g., a logical '0'). The FFs 602-608, 632-636, 642, 644 may be D FFs with asynchronous reset.

An input (D) node of the FF 602 is electrically connected to a logically high node (e.g., to VDD), and an output (Q) node of the FF 602 is electrically connected to an input (D) node of the FF 604. An output (Q) node of the FF 604 is electrically connected to a first input node of the AND gate 610. The output (Q) node of the FF 604 is a first counter reset node (CC1_RST_N). The APP_RST_N is electrically connected to a second input node of the AND gate 610, and an output node of the AND gate 610 is electrically connected to a reset input node (RESET_N(CC1)) of the first counter 622 and to an inverting reset input node of the FF 632.

An input (D) node of the FF 606 is electrically connected to the EN_HOLD, and an output (Q) node of the FF 606 is electrically connected to an input (D) node of the FF 608. An output (Q) node of the FF 608 is electrically connected to an enable input node (ENABLE_N(CC1)) of the first counter 622 and to an input (D) node of the FF 642.

Respective clock input nodes of the FFs 602-608 are electrically connected to the APP_CLK. A clock input node (CLK(CC1)) of the first counter 622 is electrically connected to the APP_CLK. A first input node of the AND gate 612 is electrically connected to the LINE_SCL, and a second input node of the AND gate 612 is electrically connected to the APP_RST_N. An output node of the AND gate 612 is electrically connected to respective inverting reset input nodes of the FFs 602, 604. In the illustrated configuration, the FFs 602, 604 may be a reset synchronizer. Respective inverting reset input nodes of the FFs 606, 608 are electrically connected to the APP_RST_N.

An output node (OUT(CC1)) of the first counter 622 is electrically connected to an input (D) node of the FF 632, and an output (Q) node of the FF 632 is electrically connected to an input (D) node of the FF 634. An output (Q) node of the FF 634 is electrically connected to an input (D) node of the FF 636, and an output (Q) node of the FF 636 is electrically connected to an input node of the inverter 638. An output node of the inverter 638 is the EN_RST_N. Respective clock input nodes of the FFs 632, 634, 636, 642 are electrically connected to the APP_CLK. Respective inverting reset input nodes of the FFs 634, 636, 642 are electrically connected to the APP_RST_N.

An output (Q) node of the FF 642 is electrically connected to an input (D) node of the FF 644. The output (Q) node of the FF 642 is a gating activation node (C). An output (Q) node of the FF 644 is electrically connected to a first input node (e.g., a non-inverting input node) of the NAND gate 648. The LINE_SCL is electrically connected to a clock input node of the FF 644 and to a second input node (e.g., an inverting input node) of the NAND gate 648. An output node of the NAND gate 648 is the GATED_SCL2.

In some examples, generally, the first counter 622 is configured, when enabled, to decrement a count based on a clock signal at the CLK(CC1) (e.g., the APP_CLK), where the count starts at a target number, which may be programmed in memory of the first counter 622, and is decremented until reaching, e.g., a one value. The first counter 622 outputs on the OUT(CC1) a logically low value, except when the counter reaches the one value, the first counter 622 outputs on the OUT(CC1) a logically high pulse. In some examples, generally, the first counter 622 is configured, when enabled, to increment a count based on the clock signal, where the count starts at a zero value and is incremented until reaching a target number, and when the count reaches the target number, to output on the OUT(CC1) of the first counter 622 a logically high pulse. The first counter 622 is further configured to reset the count to the starting number (e.g., the target number when decrementing or the zero value when incrementing) when the RESET_N(CC1) of the first counter 622 is asserted and/or ENABLE_N(CC1) of the first counter 622 is de-asserted.

With the logic of the illustrated example, when the RESET_N(CC1) of the first counter 622 is logically low (e.g., logical '0') and/or when the ENABLE_N(CC1) of the first counter 622 is logically high (e.g., logical '1'), the count is reset to a target number. Further, when the RESET_N (CC1) of the first counter 622 is logically high (e.g., logical '1') and the ENABLE_N(CC1) of the first counter 622 is logically low (e.g., logical '0'), the count is decremented based on the APP_CLK, and a logically high pulse is output on the OUT(CC1) of the first counter 622 when the count reaches a one value. The first counter 622 may be or include a controller or processor programmed according to the appropriate functionality, a logic state machine, a hardened logic circuit, a logic circuit instantiated on a programmable logic circuit, the like, or a combination thereof. For an I3C bus, the target number may be a number such that the period of the APP_CLK times the target number is a duration of an idle period to be detected before detecting a start condition or a stop condition.

Figure 7:
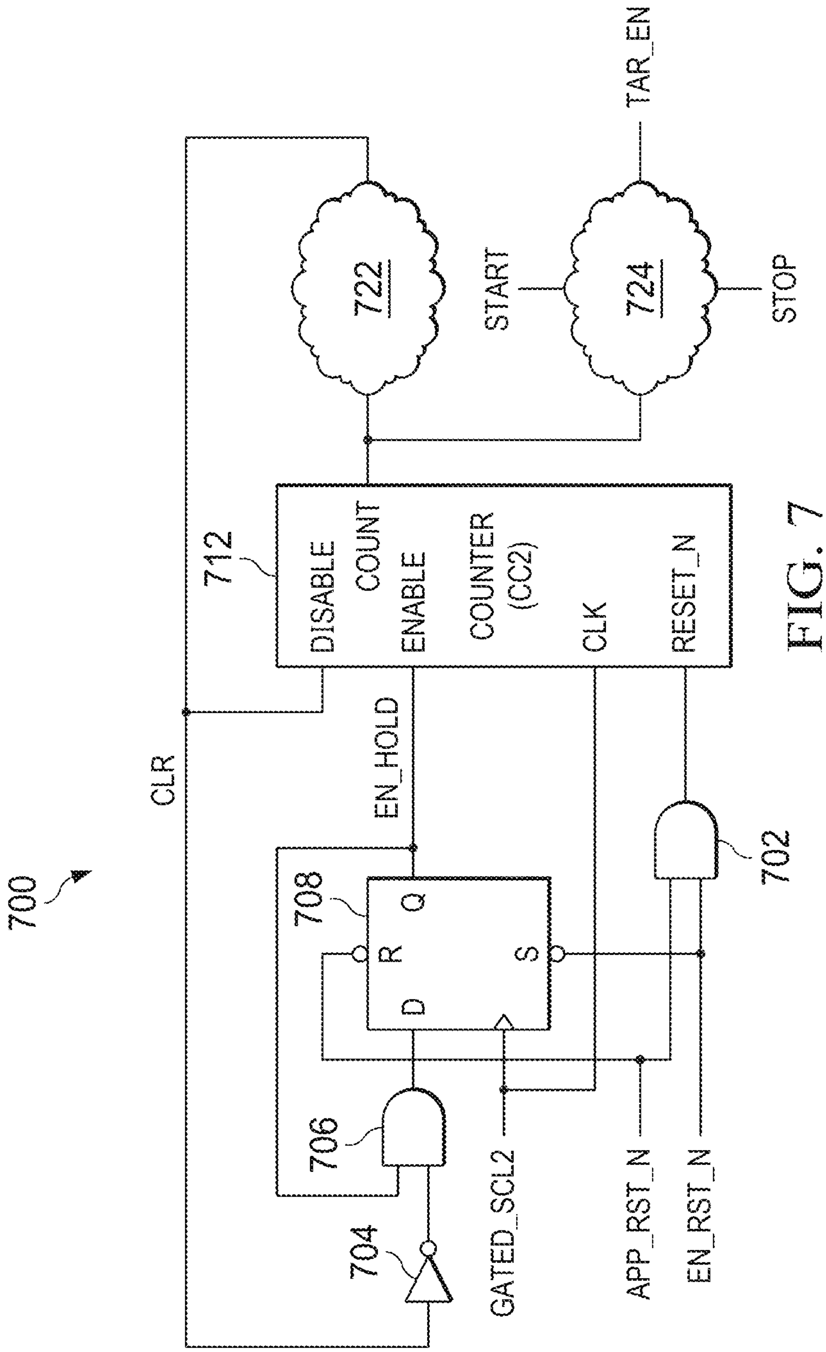
FIG. 7 is a circuit schematic of a safe state detection circuit according to some examples.

FIG. 7 is a circuit schematic of a safe state detection circuit 700 according to some examples. The safe state detection circuit 700 includes AND gates 702, 706, an inverter 704, an FF 708, a second counter (CC2) 712, and logic circuits 722, 724. The FF 708 is configured to be set such that an output (Q) node is logically high (e.g., a logical '1') and reset such that the output (Q) node is logically low (e.g., a logical '0'). The FF 708 may be a D FF with asynchronous set-reset.

An output node of the inverter 704 is electrically connected to a first input node of the AND gate 706, and an output node of the AND gate 706 is electrically connected to an input (D) node of the FF 708. An output (Q) node of the FF 708 is electrically connected to an enable input node (ENABLE(CC2)) of the second counter 712 and is electrically connected to a second input node of the AND gate 706. The output (Q) node of the FF 708 is or is electrically connected to the EN_HOLD that is electrically connected to the input (D) node of the FF 606 of FIG. 6.

The GATED_SCL2 of FIG. 6 is electrically connected to a clock input node of the FF 708 and is electrically connected to a clock input node (CLK(CC2)) of the second counter 712. The EN_RST_N of FIG. 6 is electrically connected to a first input node of the AND gate 702 and is electrically connected to an inverting set input node of the FF 708. The APP_RST_N is electrically connected to a second input node of the AND gate 702 and is electrically connected to an inverting reset input node of the FF 708. An output node of the AND gate 702 is electrically connected to a reset input node (RESET_N(CC2)) of the second counter 712.

A count output node (COUNT(CC2)) of the second counter 712 is electrically connected to respective input nodes of the logic circuits 722, 724. An output node of the logic circuit 722 is electrically connected to an input node of the inverter 704 and is electrically connected to a disable input node (DISABLE (CC2)) of the second counter 712. The output node of the logic circuit 722 is a clear node (CLR). The START and STOP are electrically connected to respective input nodes of the logic circuit 724. An output node of the logic circuit 724 is or is electrically connected to the TAR_EN.

In some examples, generally, the second counter 712 is configured, when enabled, to increment a count based on a clock signal (e.g., the GATED_SCL2) received at the CLK (CC2) of the second counter 712. In some examples, generally, the second counter 712 may be configured, when enabled, to decrement a count from a target number based on the clock signal. The target number times a period of the clock signal (e.g., the duration of the target number of cycles of the clock signal) may be the safe duration. The second counter 712 outputs on the COUNT(CC2) the count. The second counter 712 is further configured to reset the count to a zero value when the RESET_N(CC2) of the second counter 712 is asserted.

In the illustrated example, when the RESET_N(CC2) of the second counter 712 is logically low (e.g., logical '0'), the count is reset to a zero value. Further, when (i) the RESET_N(CC2) of the second counter 712 is logically high (e.g., logical '1') and (ii) (a) the ENABLE(CC2) of the second counter 712 is logically low (e.g., logical '0') or (b) the DISABLE (CC2) of the second counter 712 is logically high (e.g., logical '1'), the count maintains a number without being incremented. When the RESET_N(CC2) of the second counter 712 is logically high (e.g., logical '1'), the ENABLE(CC2) of the second counter 712 is logically high (e.g., logical '1'), and the DISABLE (CC2) of the second counter 712 is logically low (e.g., logical '0'), the count is incremented based on the GATED_SCL2 received at the CLK(CC2). The second counter 712 may be configured to cease incrementing the count when the target number is reached (or cease decrementing when zero is reached). The second counter 712 may be or include a controller or processor programmed according to the appropriate functionality, a logic state machine, a hardened logic circuit, a logic circuit instantiated on a programmable logic circuit, the like, or a combination thereof.

The signals on the START and STOP may be generated by, e.g., the bus monitor circuit 218 in the communication circuit 204. As described with respect to FIG. 2, the bus monitor circuit 218 monitors the GATED_SCL1 and GATED_SDA1 (of FIG. 3) to determine whether a start condition or a stop condition from the communication bus is detected. For example, the start condition may be that the GATED_SCL1 is logically high and the GATED_SDA1 transitions from logically high to logically low. The stop condition may be that the GATED_SCL1 is logically high and the GATED_SDA1 transitions from logically low to logically high. The bus monitor circuit 218 may assert the START when a start condition is detected and may assert the STOP when a stop condition is detected.

The logic circuit 722 is configured to output on the CLR a logically high value (e.g., logical '1') when the count on the COUNT(CC2) of the second counter 712 is equal to or greater than a communication length target number; otherwise, the logic circuit 722 is configured to output on the CLR a logically low value (e.g., logical '0'). The logic circuit 724 is configured to output to the TAR_EN an asserted signal when the count output by the second counter 712 is (i) greater than zero and less than the communication length target number and (ii) the START or the STOP is asserted; otherwise, the logic circuit 724 is configured to output to the TAR_EN a de-asserted signal. In examples in which the communication bus is an I3C bus, the communication length target number is 10. For I3C implementations, the address phase of a transfer is 9 bits, which includes 7 bits of address, one bit of read or write indication (RmW), and one bit of acknowledgment (ACK/NACK). In I3C, after the address phase, if a START or STOP is detected within a 10-bit transfer, then the host device has aborted that transfer and will issue a fresh transfer. This fresh transfer can be decoded by the target device, and hence, the target device can be enabled for that decoding. The value of 10 for the communication length target number in an I3C example is to know if the present transfer is continuing or if a fresh transfer is going to start during the address phase. The logic circuits 722, 724 each may be or include a controller or processor programmed according to the appropriate functionality, a logic state machine, a hardened logic circuit, a logic circuit instantiated on a programmable logic circuit, the like, or a combination thereof.

Figure 8:
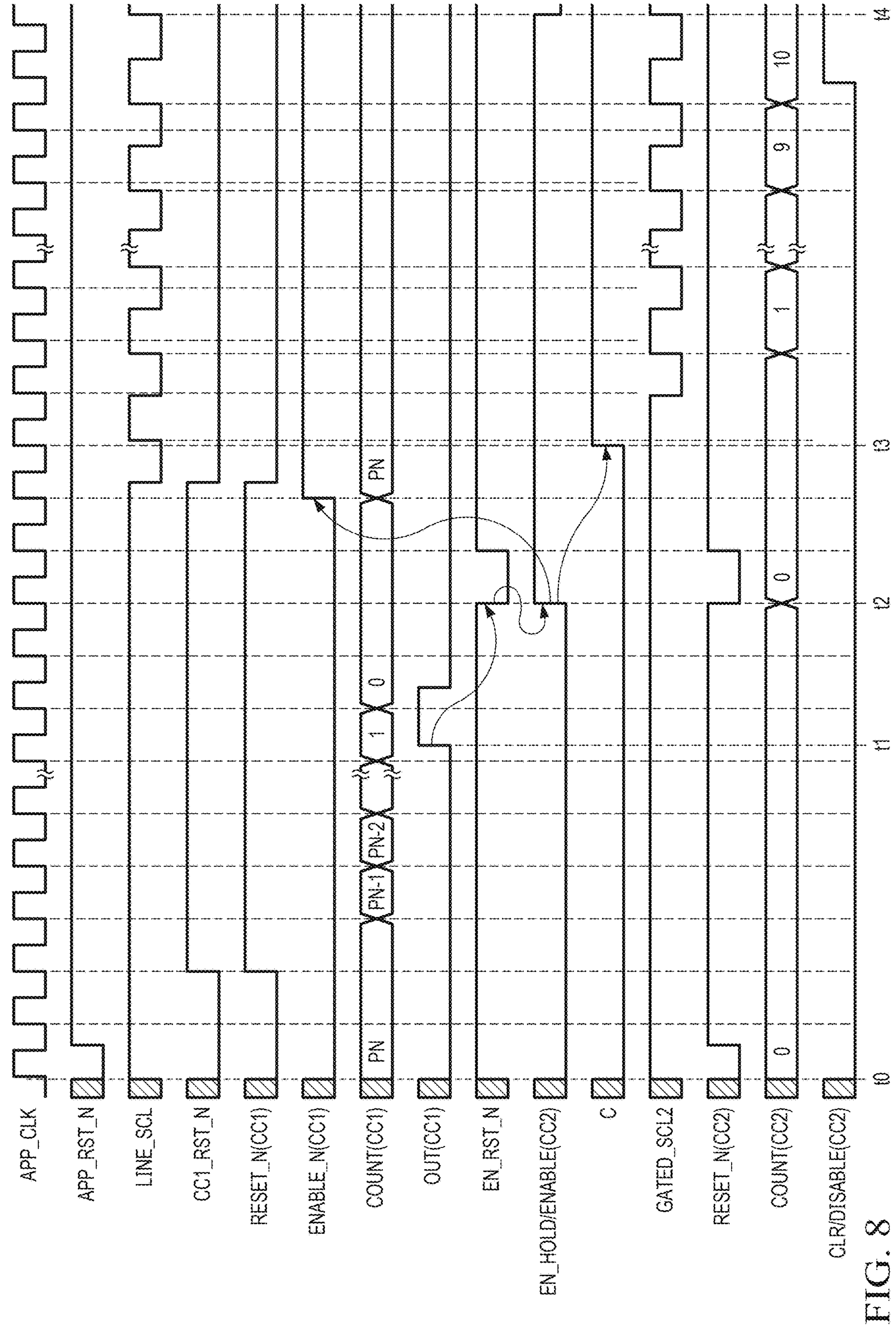
FIG. 8 is a waveform chart of signals on various nodes in the idle state detection circuit of FIG. 6 and the safe state detection circuit of FIG. 7 to illustrate operations of those circuits according to some examples.

FIG. 8 is a waveform chart of signals on various nodes in the idle state detection circuit 600 of FIG. 6 and the safe state detection circuit 700 of FIG. 7 to illustrate operations of those circuits according to some examples. At time to, the APP_RST_N is asserted. Assertion of the APP_RST_N causes the FFs 602-608, 632, 634, 636, 642, 644, 708 to be reset such that the respective output (Q) nodes of those FFs are logically low (e.g., logical '0'). Further, assertion of the APP_RST_N causes the first counter 622 to have the count (Count(CC1)) be reset to a programmed number (PN) (e.g., due to RESET_N(CC1) being asserted based on the APP_RST_N) and causes the second counter 712 to have the COUNT(CC2) be reset to zero (e.g., due to RESET_N(CC2) being asserted based on the APP_RST_N). Hence, the first counter 622 outputs on OUT(CC1) logically low (e.g., logical '0') at the time of the assertion of the APP_RST_N. Further, since the COUNT(CC2) is less than the communication length target number, the CLR output by the logic circuit 722, which is input to the DISABLE (CC2), is logically low (e.g., logical '0'). Generally, the FFs 606, 608, 632, 634, 636, 642, 644, 708 remain in this logically low (e.g., logical '0') state until the OUT(CC1) changes from logically low (e.g., logical '0').

Once the APP_RST_N is de-asserted and while the LINE_SCL remains inactive, the RESET_N(CC1) remains asserted until the second rising edge of the APP_CLK following the de-assertion of the APP_RST_N, at which time the RESET_N(CC1) becomes de-asserted. This is due to the logically high value connected to the input (D) node of the FF 602 propagating through the FFs 602, 604 to the CC1_RST_N. Then, with the ENABLE_N(CC1) being logically low (e.g., logical '0') due to the states of the FFs 708, 606, 608 being logically low, the first counter 622 decrements the Count(CC1) from the PN to zero based on the APP_CLK (e.g., rising edges of the APP_CLK). In the illustrated example, the LINE_SCL remains inactive through the time that the Count(CC1) reaches one, and accordingly, the CC1_RST_N and, hence, the RESET_N (CC1) remain de-asserted through the time that the Count (CC1) reaches one. Once the Count(CC1) reaches one, the first counter 622 outputs on OUT(CC1) a pulse at time t1. The pulse on OUT(CC1) is sampled by the FF 632 and is propagated through the FFs 634, 636 to cause the EN_RST_N to be asserted at time t2.

The assertion of the EN_RST_N at time t2 causes the FF 708 to be set such that the EN_HOLD—the output (Q) node of the FF 708—and, hence, the ENABLE(CC2) are logically high (e.g., logical '1'). Further, the assertion of the EN_RST_N at time t2 causes the RESET_N(CC2) to be asserted, which causes the COUNT(CC2) of the second counter 712 to be reset to zero. The logically high value of the EN_HOLD propagates through the FFs 606, 608 to the ENABLE_N(CC1) and then through the FF 642 to the C at time t3. When ENABLE_N(CC1) becomes a logically high value (e.g., logical '1'), the Count(CC1) is reset to the PN. When the logically high value of the EN_HOLD propagates through the FF 642 to the C at time t3, the gating of the LINE_SCL for the GATED_SCL2 is deactivated upon the next rising edge of the LINE_SCL.

In the illustrated example, the LINE_SCL becomes active after the pulse is output on the OUT(CC1) at time t1. Once the LINE_SCL becomes active, the CC1_RST_N becomes asserted such that RESET_N(CC1) is asserted and the Count(CC1) is reset to the PN. When the LINE_SCL is logically low, the FFs 602, 604 are reset such that the respective output (Q) nodes of the FFs 602, 604 are logically low (e.g., logical '0'). Due to the serial configuration of the FFs 602, 604, the CC1_RST_N may remain logically low for at least one cycle of APP_CLK after the LINE_SCL transitions to logically high.

With the gating deactivated at time t3, the GATED_SCL2 is the LINE_SCL upon the next rising edge of the LINE_SCL following time t3. With the EN_HOLD, and hence, ENABLE(CC2), logically high, the second counter 712 is enabled to begin incrementing the COUNT(CC2) based on the GATED_SCL2 (e.g., on rising edges of the GATED_SCL2).

Assuming that neither a start condition nor a stop condition is detected (e.g., such that the START and STOP remain not asserted) during incrementing the COUNT(CC2) through reaching a communication length target number, once the COUNT(CC2) reaches the communication length target number (e.g., 10 in the illustrated example) the logic circuit 722 transitions the CLR to logically high (e.g., logical '1'). With the CLR being logically high, the DISABLE (CC2) of the second counter 712 is logically high to disable incrementing the COUNT(CC2) of the second counter 712 (e.g., to maintain the COUNT(CC2)). Further, the output of the inverter 704 and, hence, the AND gate 706 are logically low (e.g., logical '0'), which is sampled by the FF 708 at the next rising edge of the GATED_SCL2 at time t4 to cause the EN_HOLD to be logically low.

With the EN_HOLD being logically low, the ENABLE (CC2) is logically low to disable incrementing the COUNT (CC2) of the second counter 712 (e.g., to maintain the COUNT(CC2)). The logical low value of the EN_HOLD propagates through the FFs 606, 608 such that ENABLE_N (CC1) becomes logically low to enable the first counter 622, which may be continuously reset at RESET_N(CC1) as long as the LINE_SCL remains active (e.g., by causing the CC1_RST_N to remain logically low). Additionally, the logical low value of the EN_HOLD propagates through the FF 642 to cause the C to become logically low to activate gating of the LINE_SCL for the GATED_SCL2. The EN_HOLD being logically low generally resets the idle state detection circuit 600 for safe state detection enable generation by detecting an idle state of the LINE_SCL. Generally, as long as the START and STOP remain not asserted, the idle state detection circuit 600 and safe state detection circuit 700 repeatedly cycle through idle state detection and safe state detection enable generation and determining a safe state.

In another example of operations, assume that the LINE_SCL (and LINE_SDA) becomes active before the Count(CC1) reaches one. In such circumstances, the CC1_RST_N becomes logically low (e.g., logical '0') by the LINE_SCL resetting the FFs 602, 604. With the CC1_RST_N being logically low, the RESET_N(CC1) is asserted to continuously reset the Count(CC1) to the PN until the LINE_SCL becomes inactive. Once the LINE_SCL becomes inactive and remains inactive for a sufficient duration, the Count(CC1) may be decremented from PN to one and output on OUT(CC1) the pulse as described previously. If at any time during the decrementing by the first counter 622 before the Count(CC1) reaches one the LINE_SCL becomes active, the Count(CC1) becomes reset to the PN.

In some instances, the LINE_SCL may become active as the pulse on OUT(CC1) is being output. Hence, the Count (CC1) may be reset to the PN due to the LINE_SCL resetting the FFs 602, 604, which asserts the CC1_RST_N and, resultingly, the RESET_N(CC1). Additionally, with the CC1_RST_N asserted, the FF 632 is reset. In this circumstance, a set up time or hold time violation may occur at the FF 632 due to de-assertion of the CC1_RST_N during a setup or hold window of the APP_CLK and result in metastability at the FF 632. The presence of FFs 634, 636 may stabilize the ringing effect of the FF 632 in case the FF 632 enters a metastable state.

If the LINE_SCL is inactive for a sufficient duration such that the pulse on OUT(CC1) is generated but becomes active following that pulse and before the C transitions to logically high, gating of the LINE_SCL is activated, and the GATED_SCL2 remains logically high until a rising edge of the LINE_SCL following the transition of the C to logically high. In such circumstances, the counting by the second counter 712 is delayed until the gating of the LINE_SCL is deactivated such that the GATED_SCL2 is the LINE_SCL. In this scenario, the bus monitor circuit 218 may detect a start or stop condition and assert the START or STOP before the second counter 712 begins incrementing the COUNT (CC2). With the COUNT(CC2) not being incremented and being zero when the start or stop condition is detected, the TAR_EN is not asserted (since the COUNT(CC2) is not greater than zero) upon the detection of the start or stop condition.

With the gating for GATED_SCL2 subsequently becoming deactivated and the second counter 712 beginning incrementing the COUNT(CC2), another start or stop condition may be detected for the logic circuit 724 to assert the TAR_EN. For example, in an I3C example, a host device may abort a transfer (e.g., for which the start or stop condition was detected before the COUNT(CC2) was incremented), such as during communicating an address, and may issue another start and/or stop condition before the COUNT (CC2) of the second counter 712 reaches the communication length target number. In such a situation, the logic circuit 724 asserts the TAR_EN to enable the target device to join the communication bus. Otherwise, the second counter 712 will increment the COUNT(CC2) until the COUNT(CC2) reaches the communication length target number, at which point the logic circuit 722 will transition the CLR to logically high, which disables the second counter 712 and causes the EN_HOLD to transition to logically low at a next rising edge of the GATED_SCL2. The logically low value of the EN_HOLD propagates to the FFs 608, 642 to enable the first counter 622 and activate gating for the GATED_SCL2. Another cycle of detecting an idle state may then begin.

If the LINE_SCL is inactive for a duration following the pulse on OUT(CC1) being generated and the C transitioning to logically high, the second counter 712 is enabled and awaiting to count and does not count while the LINE_SCL is inactive. Once C transitions to logically high, the gating for LINE_SCL for the GATED_SCL2 is deactivated, and the GATED_SCL2 remains logically high while the LINE_SCL is inactive. Once the LINE_SCL becomes active, the GATED_SCL2 is the LINE_SCL, and the second counter 712 begins incrementing the COUNT(CC2) while the GATED_SCL2 is active. If a start or stop condition is detected (and the START or STOP is asserted) while the second counter 712 is incrementing the COUNT(CC2) and before the COUNT(CC2) reaches the communication length target number, the logic circuit 724 asserts the TAR_EN; otherwise, once the COUNT(CC2) reaches the communication length target number, the logic circuit 722 transitions the CLR to logically high to begin another cycle of idle state detection as described above.

More generally, the idle state detection circuit 600 monitors the communication bus for activity, and when the communication bus is inactive for a sufficiently long duration, the idle state detection circuit 600 enables the safe state detection circuit 700 to detect a safe state of the communication bus for the target device to join. The first counter 622 generally tracks the LINE_SCL for any event. The first counter 622 monitors the communication bus (e.g., the LINE_SCL) to determine if the communication bus is in idle state. When the first counter 622 determines the communication bus is in an idle state, the target device may be enabled for proper decoding of the communication bus (e.g., the GATED_SCL1 and GATED_SDA1).

To illustrate in the context of an I3C bus, the first counter 622 determines that the communication bus is in idle state while the LINE_SCL is continuously logically high, as per the I3C specification. The first counter 622 is pre-loaded with a programmed number greater than the maximum high period of the LINE_SCL so that when the count of the first counter 622 expires, the expiration of the count indicates that the I3C bus is in an idle state, and the safe state detection circuit 700 can be enabled. The first counter 622 monitors the LINE_SCL by the reset synchronizer formed by the FFs 602, 604 being reset by activity on the LINE_SCL, and the resetting of the reset synchronizer resets the count of the first counter 622 to the programmed number. The programmed number is greater than the maximum duration of a communication on the I3C bus. Hence, the expiration of the counter indicates an idle state of the communication bus, and resetting the counter before expiration indicates activity, such as a communication or transfer, on the communication bus. If there is no event on the LINE_SCL, the count of the first counter 622 will expire, which causes the pulse to be output on the OUT(CC1) that indicates that the communication bus is idle and enables the safe state detection circuit 700.

This pulse, once propagated to the EN_RST_N, asynchronously sets the FF 708. The set value of the FF 708 propagates through the FFs 606, 608, 642 to then deactivate gating of the LINE_SCL for generation of the GATED_SCL2, which is input to the safe state detection circuit 700. Gating of the LINE_SCL is activated prior to the set value of the FF 708 propagating through to the FF 642, which permits avoiding metastability in the safe state detection circuit 700. The FFs 606, 608 may be a synchronizer to synchronize the set vale of the FF 708 to the domain of the APP_CLK. The LINE_SCL is gated at least three cycles of the APP_CLK following the asynchronous setting of the FF 708 due to the propagation of the set value through the FFs 606, 608, 642.

Once enabled, the safe state detection circuit 700 detects a condition of the communication bus to determine a safe time to join the communication bus. The output of the FF 708, when set based on the EN_RST_N, enables the second counter 712. Once gating is deactivated for the GATED_SCL2, the second counter 712 starts incrementing to a communication length target number, which may be protocol specific (e.g., for 13C, the communication length target number may be 10, since the address phase for 13C transfers are 8 cycles of an SCL clock). While the count of the second counter 712 is being incremented, if a transfer termination condition occurs on the communication bus (e.g., for I3C, a STOP or HDR exit pattern on the communication bus), the logic circuit 724 enables the target device through TAR_EN, and the target device may continue decoding properly the next transfer on the communication bus. In case the transfer termination condition is not detected and the count of the second counter 712 reaches the communication length target number, the logic circuit 724 does not assert the TAR_EN, and the first counter 622 is enabled, by a logically high value of EN_HOLD propagating through the synchronizer of the FFs 606, 608, to re-initiate the first counter 622. The first counter 622 being re-initiated causes the first counter 622 to again look for a bus idle state to enable the safe state detection circuit 700 at an appropriate time.

As indicated previously, in some instances, the GATED_SCL1 may become active (e.g., traffic starting on the communication bus) following the pulse output on OUT(CC1) and before deactivating the gating by the C transitioning to a logically high value. In these instances, the LINE_SCL is gated for GATED_SCL2 before the C transitions, and logic circuit(s) of the target device may not be able to sample the first few bits of the GATED_SDA1. This may make the target device see traffic on the I3C line without a proper START, and hence, the target device may not be able to decode the communication to give a proper response on the I3C bus. The second counter 712 and logic circuits 722, 724 may prevent the target logic from wrongly decoding traffic on the communication bus when the communication bus becomes active when the LINE_SCL and LINE_SDA are gated and responding incorrectly. The safe state detection circuit 700 may be used to disable the decoding of the incoming GATED_SDA1 and prevent spurious driving of input/output (IO) pads of the semiconductor die that are connected to the communication bus. Accordingly, the second counter 712 may cause the target device to be in a safe state and may prevent incorrect driving of IO pads and decoding. The safe state detection circuit 700 may predict the point after which the target device may take part in the traffic by proper decoding of incoming communications on the LINE_SDA.

Figure 9A:
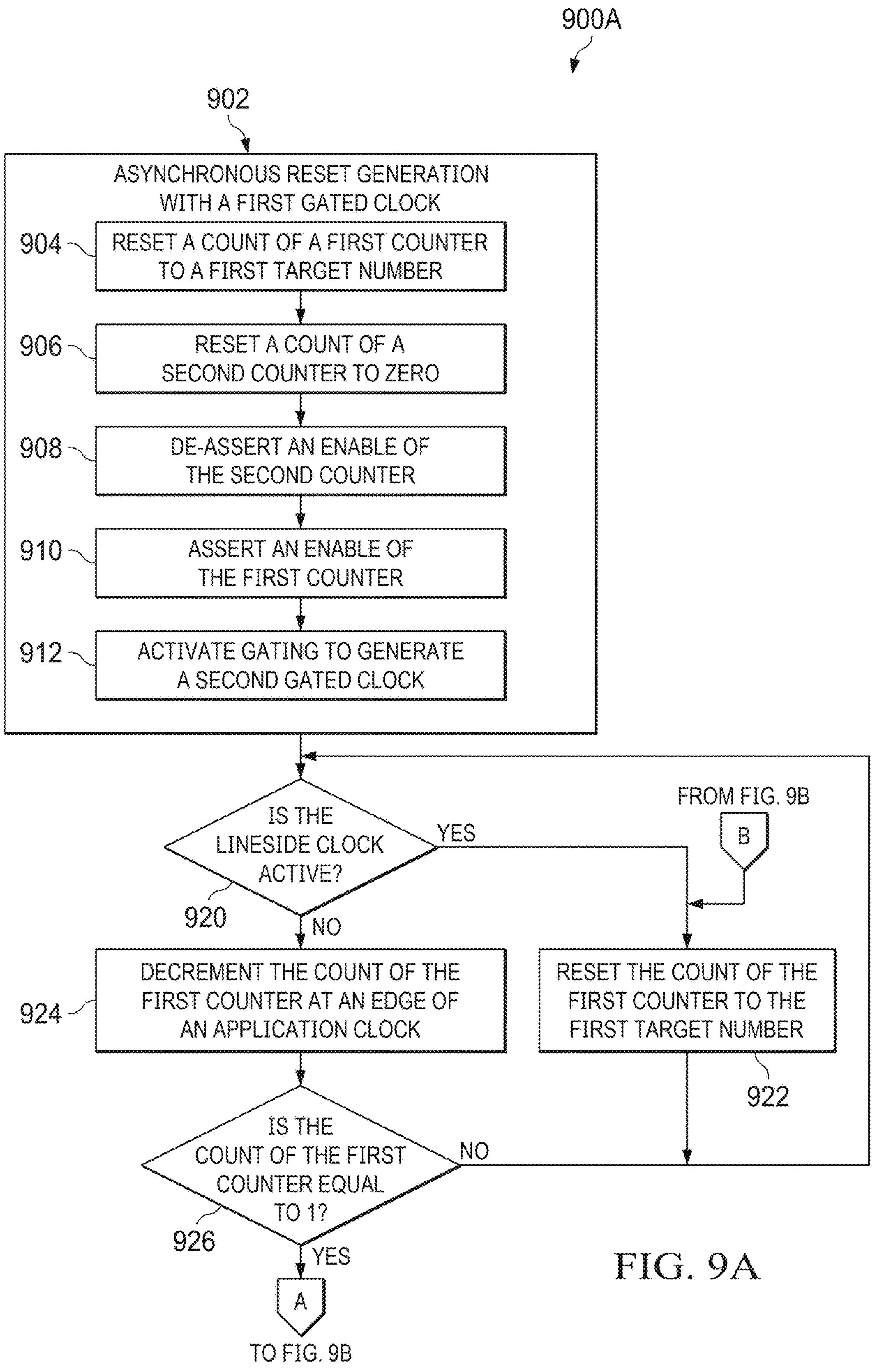
FIGS. 9A and 9B are a flowchart of a method of operation of the reset control circuit of FIG. 3, the idle state detection circuit of FIG. 6, and the safe state detection circuit of FIG. 7 according to some examples.
Figure 9B:
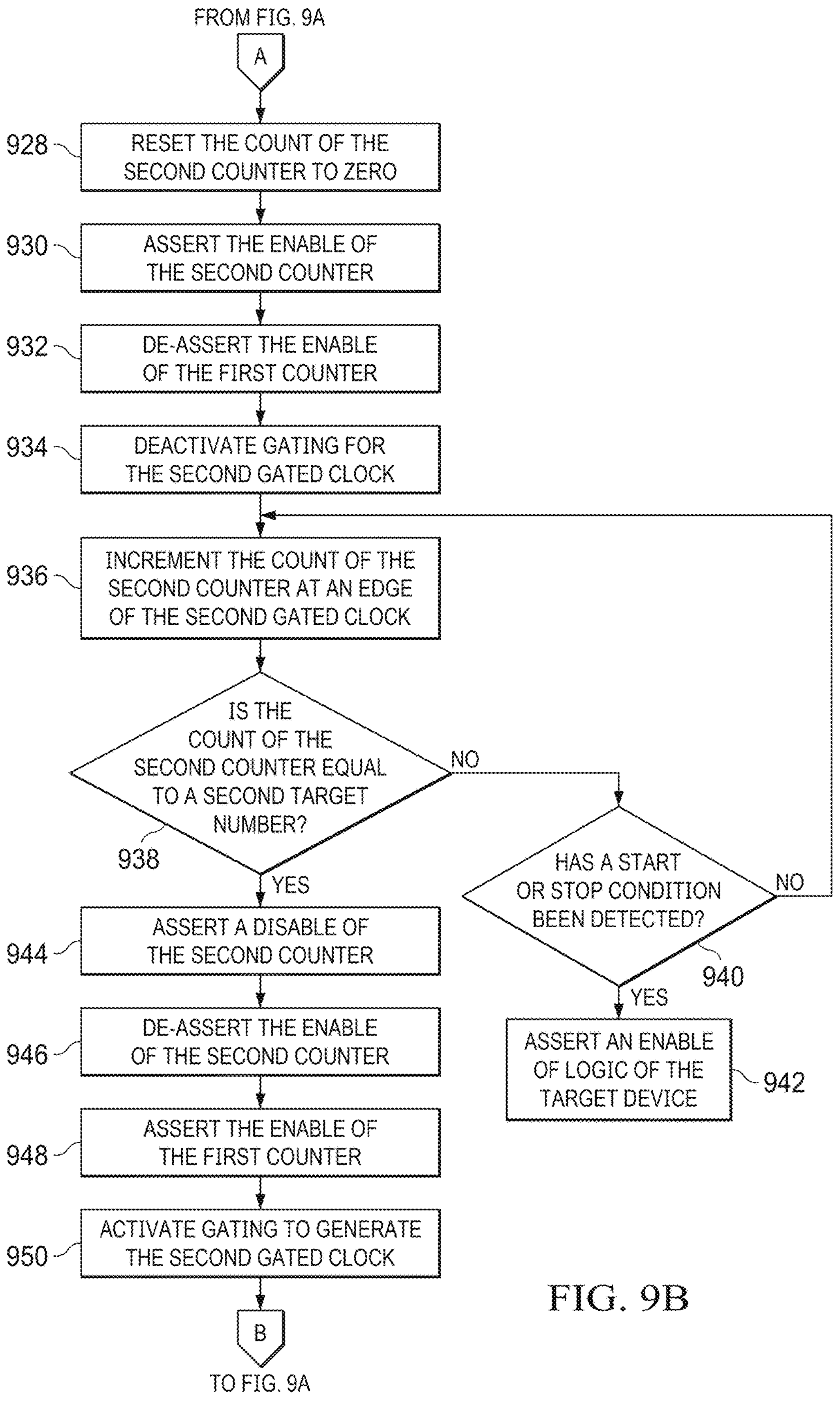

FIGS. 9A and 9B are a flowchart of a method 900A, 900B of operation of the reset control circuit 300 of FIG. 3, the idle state detection circuit 600 of FIG. 6, and the safe state detection circuit 700 of FIG. 7 according to some examples. The method 900A, 900B is an example implementation of the method 100 of FIG. 1. Although various operations are illustrated in a sequence, many operations may be performed asynchronously relative to other operations such that the order may vary. Further, some delay or timing of operations may vary due to the presence of various FFs.

At block 902, asynchronous reset generation with a first gated clock is performed. The APP_RST_N is asserted. In the reset control circuit 300, the FFs 302-310 are reset to a logically low value, and the FF 316 is set to a logically high value. While the logically high value propagates through the FFs 302, 304, gating of the LINE_SCL and LINE_SDA is activated to generate the GATED_SCL1 and GATED_SDA1, respectively. Once the logically high value is sampled and latched at the FF 306, the gating is deactivated such that the GATED_SCL1 and GATED_SDA1 are the LINE_SCL and LINE_SDA following respective rising edges of the LINE_SCL and LINE_SDA, respectively.

The asynchronous reset generation of block 902 further includes resetting a count of a first counter to a target number at block 904, resetting a count of a second counter to zero at block 906, de-asserting an enable of the second counter at block 908, asserting an enable of the first counter at block 910, and activating gating to generate a second gated clock. In the idle state detection circuit 600, the Count(CC1) of the first counter 622 is reset with the assertion of APP_RST_N reaching RESET_N(CC1) per block 904, and ENABLE_N (CC1) of the first counter 622 is asserted by the resetting of the FFs 708, 606, 608 per block 910. In the safe state detection circuit 700, the COUNT(CC2) of the second counter 712 is reset to zero with the assertion of APP_RST_N reaching RESET_N(CC2) per block 906, and ENABLE(CC2) of the second counter 712 is de-asserted by the resetting of the FF 708 per block 908. Gating is activated per block 912 by the resetting of the FFs 708, 606, 608, 642 such that the C is logically low.

At block 920, whether the lineside clock is active is determined. If the lineside clock is active as determined at block 920, the count of the first counter is reset to the first target number at block 922, and the method 900A, 900B loops to block 920. If the lineside clock is not active as determined at block 920, the count of the first counter is decremented by one at an occurrence of an edge (e.g., rising edge) of an application clock at block 924. At block 926, whether the count of the first counter is equal to one is determined. If the count of the first counter is not equal to one as determined at block 926, the method 900A, 900B loops to block 920. If the count of the first counter is equal to one as determined at block 926, the count of the second counter is reset to zero at block 928; the enable of the second counter is asserted at block 930; the enable of the first counter is de-asserted at block 932; and gating of the second gated clock is deactivated at block 934.

In the idle state detection circuit 600, when the LINE_SCL is active, the FFs 602, 604 are reset to assert the CC1_RST_N, which reaches the RESET_N(CC1) of the first counter 622 to reset the Count(CC1) per blocks 920, 922. While the LINE_SCL is not active per block 920 and with the ENABLE_N(CC1) asserted per block 910 in an initial iteration (or block 948 in a subsequent iteration), the first counter 622 decrements the Count(CC1) at a rising edge of the APP_CLK per block 924 until the Count(CC1) reaches one per block 926. When the Count(CC1) reaches one per block 926, the first counter 622 outputs on the OUT(CC1) a pulse that propagates through the FFs 632-636 to cause EN_RST_N to be asserted. In the safe state detection circuit 700, the EN_RST_N being asserted causes the RESET_N(CC2) of the second counter 712 to be asserted to reset the COUNT(CC2) to zero per block 928 and causes the FF 708 to be set such that EN_HOLD and ENABLE(CC2) are asserted per block 930. In the idle state detection circuit 600, the assertion of the EN_HOLD propagates through the FFs 606, 608 to the ENABLE_N(CC1) of the first counter 622 to de-assert the ENABLE_N(CC1) of the first counter 622 per block 932. The assertion of the EN_HOLD further propagates through the FF 642 to deactivate gating of the GATED_SCL2 following a next rising edge of the LINE_SCL per block 934.

At block 936, the count of the second counter is incremented at an occurrence of an edge (e.g., rising edge) of the second gated clock, and at block 938, whether the count of the second counter is equal to a second target number is determined. If the count of the second counter is not equal to the second target number as determined at block 938, whether a start or stop condition has been detected is determined at block 940. If a start or stop condition has been detected as determined at block 940, an enable of logic of the target device is asserted at block 942. If a start or stop condition has not been detected as determined at block 940, the method 900A, 900B loops to block 936.

If the count of the second counter is equal to the second target number as determined at block 938, a disable of the second counter is asserted at block 944; the enable of the second counter is de-asserted at block 946; the enable of the first counter is asserted at block 948; and gating is activated to generate the second gated clock at block 950. The method 900A, 900B loops to block 922 to reset the count of the first counter to the first target number.

In the safe state detection circuit 700, with the EN_HOLD and ENABLE(CC2) asserted per block 930, the second counter 712 increments the COUNT(CC2) at a rising edge of the GATED_SCL2 per block 936 until the COUNT(CC2) reaches the second target number per block 938 or a start or stop condition is detected by the assertion of the START or STOP per block 940. The bus monitor circuit 218 monitors the GATED_SCL1 and GATED_SDA1 to detect when a start or stop condition occurs per block 940. When a stop condition occurs, the bus monitor circuit 218 asserts the STOP, and when a stop condition occurs, the bus monitor circuit 218 asserts the STOP. If the START or STOP is asserted before the COUNT(CC2) reaches the second target number, the logic circuit 724 asserts the TAR_EN per block 942. If the COUNT(CC2) reaches the second target number per block 938 before the START or STOP is asserted, the logic circuit 722 asserts the CLR, which asserts the DISABLE (CC2) of the second counter 712 per block 944. Further, the asserted CLR is inverted and sampled by the FF 708 to de-assert the EN_HOLD. The EN_HOLD being de-asserted causes the ENABLE(CC2) of the second counter 712 to be de-asserted per block 946. The de-assertion of the EN_HOLD propagates, in the idle state detection circuit 600, through the FFs 606, 608 to assert the ENABLE_N (CC1) of the first counter 622 per block 948. Further, the de-assertion of the EN_HOLD propagates through the FF 642 to activate the gating for the GATED_SCL2 per block 950. The Count(CC1) of the first counter 622 is reset per block 922 by the ENABLE_N(CC1) being de-asserted per block 932 and/or by the CC1_RST_N being asserted by activity on the LINE_SCL, which occurs when the GATED_SCL2 is active for the second counter 712 to increment the count per block 936.

Some examples may be embodied as an intellectual property (IP) core (e.g., a digital or electronic representation) stored in a non-transitory computer-readable storage medium (e.g., memory). For example, a circuit design including a target device circuit 200, a reset control circuit 300, an idle state detection circuit 600, and/or a safe state detection circuit 700 may be embodied as an IP core stored in a non-transitory computer-readable storage medium. The IP core may be implemented as a netlist, a circuit schematic, or other representation. A user may be provided access to the IP core stored in the non-transitory computer-readable storage medium. The user can incorporate the IP core into a user design. For example, a user may download or otherwise obtain the IP core onto a computing system that implements an electronic design automation (EDA) environment and may incorporate the IP core into another circuit design using the EDA environment. The user may configure the first counter 622, second counter 712, and/or logic circuits 722, 724 to be programmed with or have a respective target number using the EDA environment. Examples of a non-transitory computer-readable storage medium include random access memory (RAM) (e.g., static RAM (SRAM) and dynamic RAM (DRAM)), read only memory (ROM), programmable ROM (PROM), erasable programmable ROM (EPROM), electrically erasable programmable ROM (EEPROM), flash, NAND memory, CD-ROM, an optical storage device, a magnetic storage device, etc. The non-transitory computer-readable storage medium, in some examples, may be standalone memory, and may be included in any computing system (e.g., a desktop computer, a laptop computer, a server, a database, etc.).

An example is a circuit including a reset control circuit. The reset control circuit is configured to be reset by a reset signal asserted on a reset node. The reset control circuit is configured to generate a first gated bus clock signal on a first gated bus clock node. The reset control circuit is configured to activate gating for the first gated bus clock signal when the reset signal is asserted on the reset node. The reset control circuit is configured to deactivate gating for the first gated bus clock signal a duration after the reset signal is de-asserted after being asserted on the reset node.

Another example is a method. A circuit in a target device is reset based on assertion of an application reset signal. Resetting the circuit includes, by a reset control circuit, activating gating of a lineside bus clock signal to generate a gated bus clock signal and activating gating of a lineside bus data signal to generate a gated bus data signal. Gating of the lineside bus clock signal and the lineside bus data signal is deactivated, by the reset control circuit, after a set number of cycles of an application clock signal following de-assertion of the application reset signal.

A further example is a non-transitory computer-readable storage medium storing an electronic representation of a circuit design. The circuit design includes a circuit. The circuit includes a reset control circuit. The reset control circuit is configured to be reset by a reset signal asserted on a reset node. The reset control circuit is configured to generate a first gated bus clock signal on a first gated bus clock node. The reset control circuit is configured to activate gating for the first gated bus clock signal when the reset signal is asserted on the reset node. The reset control circuit is configured to deactivate gating for the first gated bus clock signal a duration after the reset signal is de-asserted after being asserted on the reset node.

Figure 10:
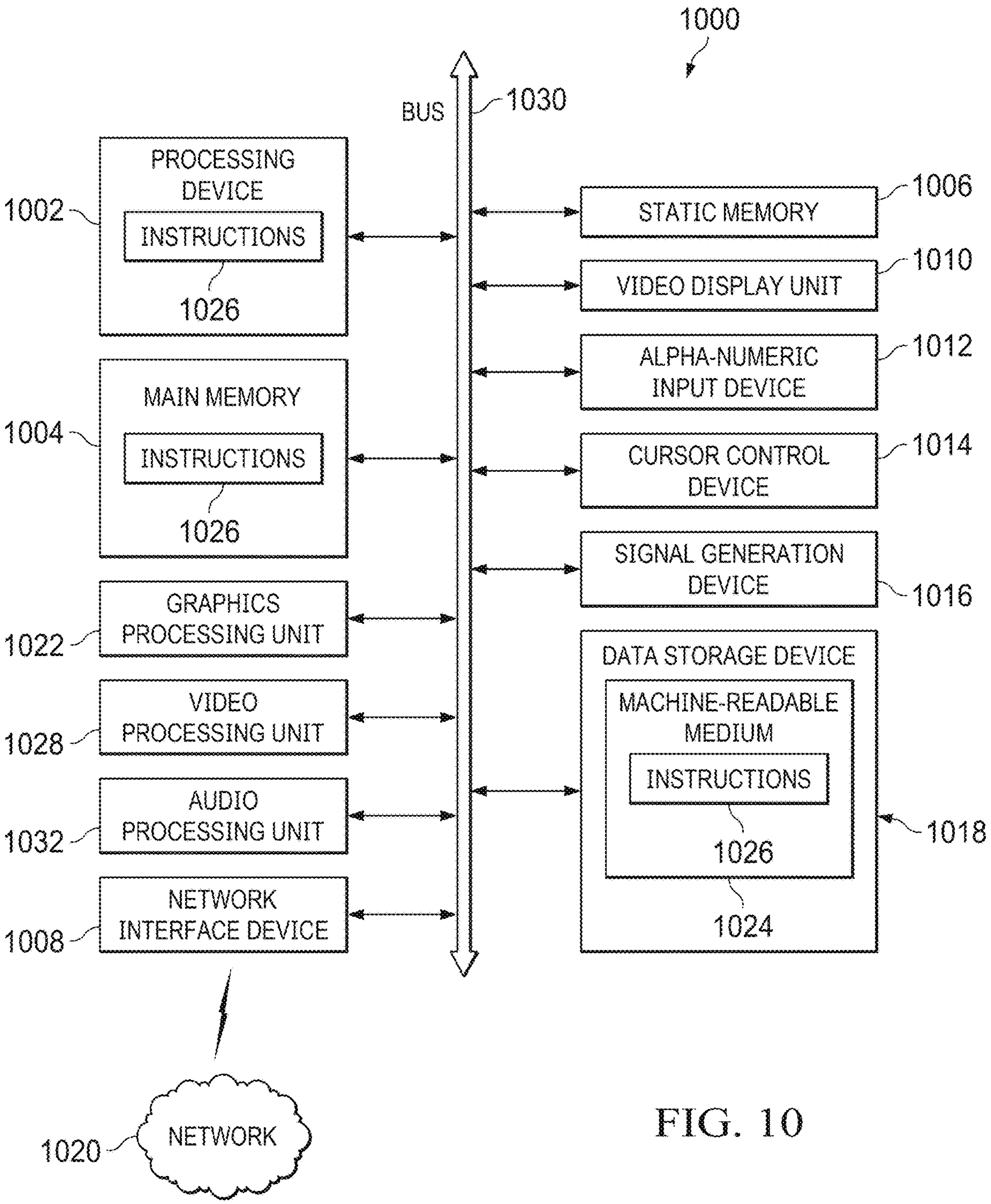
FIG. 10 depicts a diagram of an example computer system in which examples may be implemented in a user circuit design.

FIG. 10 illustrates an example machine of a computer system 1000 within which a set of instructions, for causing the machine to implement an EDA environment in which an example IP core may be incorporated into a user circuit design, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a signal generation device 1016 (e.g., a speaker), a graphics processing unit 1022, video processing unit 1028, and audio processing unit 1032.

The data storage device 1018 may include a machine-readable storage medium 1024 (also known as a non-transitory computer-readable storage medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a non-transitory computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any mechanism for storing information in a form readable by a machine (e.g., a computer). For example, a machine-readable (e.g., a computer-readable) storage medium includes a machine-readable (e.g., a computer-readable) storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:

a reset control circuit configured to be reset by a reset signal asserted on a reset node, the reset control circuit being configured to generate a first gated bus clock signal on a first gated bus clock node, the reset control circuit being configured to activate gating for the first gated bus clock signal when the reset signal is asserted on the reset node, the reset control circuit being configured to deactivate gating for the first gated bus clock signal a number of clock cycles of an application clock signal after the reset signal is de-asserted after being asserted on the reset node.

2. The circuit of claim 1, wherein the reset control circuit includes:

a first gating circuit having a gating activation node, a lineside bus clock input node, and the first gated bus clock node, the first gating circuit being configured to gate a lineside bus clock signal on the lineside bus clock input node as the first gated bus clock signal on the first gated bus clock node, the first gating circuit being configured to activate gating of the lineside bus clock signal based on assertion of a gating activation signal on the gating activation node;

a first flip-flop, a clock input node of the first flip-flop being electrically coupled to the first gated bus clock node; and a second flip-flop, an output node of the second flip-flop being electrically coupled to the gating activation node, an input node of the second flip-flop being electrically coupled to an output node of the first flip-flop.

3. The circuit of claim 2, wherein the reset control circuit includes:

a third flip-flop, an input node of the third flip-flop being electrically coupled to the output node of the first flip-flop; and a fourth flip-flop, an input node of the fourth flip-flop being electrically coupled to an output node of the third flip-flop, an output node of the fourth flip-flop being electrically coupled to the input node of the second flip-flop, respective reset input nodes of the second flip-flop, the third flip-flop, and the fourth flip-flop being electrically coupled to the reset node, a set input node of the first flip-flop being electrically coupled to the reset node, an input node of the first flip-flop being electrically coupled to a logically high node.

4. The circuit of claim 2, wherein the first gating circuit includes:

a third flip-flop, an input node of the third flip-flop being electrically coupled to the gating activation node, a clock input node of the third flip-flop being electrically coupled to the lineside bus clock input node; and a NAND gate, a non-inverting input node of the NAND gate being electrically coupled to an output node of the third flip-flop, an inverting input node of the NAND gate being electrically coupled to the lineside bus clock input node, an output node of the NAND gate being the first gated bus clock node.

5. The circuit of claim 2, wherein the reset control circuit includes:

a second gating circuit having the gating activation node, a lineside bus data input node, and a gated bus data node, the second gating circuit being configured to gate a lineside bus data signal on the lineside bus data input node as a gated bus data signal on the gated bus data node, the second gating circuit being configured to activate gating of the lineside bus data signal based on assertion of the gating activation signal on the gating activation node.

6. The circuit of claim 1, wherein the reset control circuit is configured to come out of reset after assertion of the reset signal on the reset node without dependency of activity on a lineside bus clock input node, the first gated bus clock signal on a first gated bus clock node being based on a lineside bus clock signal on the lineside bus clock input node.

7. The circuit of claim 1, further comprising:

an idle state detection circuit configured to detect an idle state of a lineside bus clock input node, the idle state detection circuit being configured to output on an output node of the idle state detection circuit an enable/reset signal asserted in response to an idle state of the lineside bus clock input node being detected; and a safe state detection circuit configured to detect a start condition or a stop condition within a safe duration following assertion of the enable/reset signal, the safe state detection circuit being configured to determine the safe duration based on activity on the lineside bus clock input node, the safe state detection circuit being configured to assert a target enable signal on a target enable node upon detecting a start condition or a stop condition within the safe duration following assertion of the enable/reset signal.

8. The circuit of claim 7, wherein:

the idle state detection circuit includes a first counter, the first counter being configured to count based on a clock signal received at a clock input node of the first counter, the first counter being configured to reset the count of the first counter upon assertion of the reset signal on the reset node and upon activity on the lineside bus clock input node, the first counter being configured to output an output signal on an output node of the first counter that is asserted upon the count of the first counter reaching a first target number, the enable/reset signal corresponding to the output signal on the output node of the first counter; and the safe state detection circuit includes a second counter and a first logic circuit, the second counter being configured to count based on activity on the lineside bus clock input node after assertion of the output signal on the output node of the first counter, the second counter being configured to reset the count of the second counter upon assertion of the reset signal on the reset node and upon assertion of the enable/reset signal, the first logic circuit being configured to assert the target enable signal on the target enable node upon detecting a start condition or a stop condition before the count of the second counter reaches a second target number.

9. The circuit of claim 8, wherein:

the idle state detection circuit includes a gating circuit having a gating activation node, the lineside bus clock input node, and a second gated bus clock node, the gating circuit being configured to gate a lineside bus clock signal on the lineside bus clock input node as a second gated bus clock signal on the second gated bus clock node, the gating circuit being configured to activate gating of the lineside bus clock signal based on assertion of a gating activation signal on the gating activation node; and the safe state detection circuit includes a flip-flop, an AND gate, an inverter, and a second logic circuit, an input node of the second logic circuit being electrically coupled to a count output node of the second counter, an output node of the second logic circuit being electrically coupled to an input node of the inverter, an output node of the inverter being electrically coupled to a first input node of the AND gate, an output node of the AND gate being electrically coupled to an input node of the flip-flop, an output node of the flip-flop being electrically coupled to an enable input node of the second counter, to a second input node of the AND gate, and the gating activation node of the gating circuit, a clock input node of the flip-flop being electrically coupled to the second gated bus clock node, a set input node of the flip-flop being electrically coupled to the output node of the idle state detection circuit, the second logic circuit being configured to assert a clear signal upon the count of the second counter output on the count output node reaching the second target number.

10. The circuit of claim 7, wherein the idle state detection circuit and the safe state detection circuit are each configured to be reset by assertion of the reset signal on the reset node.

11. The circuit of claim 7, wherein the idle state detection circuit includes a gating circuit having a gating activation node, the lineside bus clock input node, and a second gated bus clock node, the gating circuit being configured to gate a lineside bus clock signal on the lineside bus clock input node as a second gated bus clock signal on the second gated bus clock node, the gating circuit being configured to activate gating of the lineside bus clock signal based on assertion of a gating activation signal on the gating activation node, assertion of the gating activation signal on the gating activation node being based on assertion of the reset signal on the reset node and based on assertion of the enable/reset signal on the output node of the idle state detection circuit, the safe state detection circuit being configured to determine the safe duration based on activity on the second gated bus clock node.

12. A method comprising:

resetting a circuit in a target device based on assertion of an application reset signal, resetting the circuit including, by a reset control circuit, activating gating of a lineside bus clock signal to generate a gated bus clock signal and activating gating of a lineside bus data signal to generate a gated bus data signal; and deactivating, by the reset control circuit, gating of the lineside bus clock signal and the lineside bus data signal after a set number of cycles of an application clock signal following de-assertion of the application reset signal.

13. The method of claim 12, further comprising:

detecting, by an idle state detection circuit, an idle state of the lineside bus clock signal;

asserting, by the idle state detection circuit, an enable signal upon detecting the idle state of the lineside bus clock signal;

based on the assertion of the enable signal, determining, by a safe state detection circuit, whether a start condition or a stop condition occurs within a safe duration, the safe duration being based on a number of cycles of the lineside bus clock signal, a start condition or a stop condition being detected based on the gated bus clock signal and the gated bus data signal; and asserting, by the safe state detection circuit, a target enable signal when a start condition or a stop condition occurs within the safe duration.

14. A non-transitory computer-readable storage medium storing an electronic representation of a circuit design, the electronic representation of the circuit design on the non-transitory computer-readable storage medium being readable by a computer system executing an electronic design automation environment, the circuit design including a circuit, the circuit comprising:

a reset control circuit configured to be reset by a reset signal asserted on a reset node, the reset control circuit being configured to generate a first gated bus clock signal on a first gated bus clock node, the reset control circuit being configured to activate gating for the first gated bus clock signal when the reset signal is asserted on the reset node, the reset control circuit being configured to deactivate gating for the first gated bus clock signal a number of clock cycles of an application clock signal after the reset signal is de-asserted after being asserted on the reset node.

15. The non-transitory computer-readable storage medium of claim 14, wherein the reset control circuit includes:

a first gating circuit having a gating activation node, a lineside bus clock input node, and the first gated bus clock node, the first gating circuit being configured to gate a lineside bus clock signal on the lineside bus clock input node as the first gated bus clock signal on the first gated bus clock node, the first gating circuit being configured to activate gating of the lineside bus clock signal based on assertion of a gating activation signal on the gating activation node;

a first flip-flop, a clock input node of the first flip-flop being electrically coupled to the first gated bus clock node; and a second flip-flop, an output node of the second flip-flop being electrically coupled to the gating activation node, an input node of the second flip-flop being electrically coupled to an output node of the first flip-flop.

16. The non-transitory computer-readable storage medium of claim 15, wherein the reset control circuit includes:

a third flip-flop, an input node of the third flip-flop being electrically coupled to the output node of the first flip-flop; and a fourth flip-flop, an input node of the fourth flip-flop being electrically coupled to an output node of the third flip-flop, an output node of the fourth flip-flop being electrically coupled to the input node of the second flip-flop, respective reset input nodes of the second flip-flop, the third flip-flop, and the fourth flip-flop being electrically coupled to the reset node, a set input node of the first flip-flop being electrically coupled to the reset node, an input node of the first flip-flop being electrically coupled to a logically high node.

17. The non-transitory computer-readable storage medium of claim 15, wherein the reset control circuit includes:

a second gating circuit having the gating activation node, a lineside bus data input node, and a gated bus data node, the second gating circuit being configured to gate a lineside bus data signal on the lineside bus data input node as a gated bus data signal on the gated bus data node, the second gating circuit being configured to activate gating of the lineside bus data signal based on assertion of the gating activation signal on the gating activation node.

18. The non-transitory computer-readable storage medium of claim 14, wherein the circuit further includes:

an idle state detection circuit configured to detect an idle state of a lineside bus clock input node, the idle state detection circuit being configured to output on an output node of the idle state detection circuit an enable/reset signal asserted in response to an idle state of the lineside bus clock input node being detected; and a safe state detection circuit configured to detect a start condition or a stop condition within a safe duration following assertion of the enable/reset signal, the safe state detection circuit being configured to determine the safe duration based on activity on the lineside bus clock input node, the safe state detection circuit being configured to assert a target enable signal on a target enable node upon detecting a start condition or a stop condition within the safe duration following assertion of the enable/reset signal.

19. The non-transitory computer-readable storage medium of claim 18, wherein:

the idle state detection circuit includes a first counter, the first counter being configured to count based on a clock signal received at a clock input node of the first counter, the first counter being configured to reset the count of the first counter upon assertion of the reset signal on the reset node and upon activity on the lineside bus clock input node, the first counter being configured to output an output signal on an output node of the first counter that is asserted upon the count of the first counter reaching a first target number, the enable/reset signal corresponding to the output signal on the output node of the first counter; and the safe state detection circuit includes a second counter and a first logic circuit, the second counter being configured to count based on activity on the lineside bus clock input node after assertion of the output signal on the output node of the first counter, the second counter being configured to reset the count of the second counter upon assertion of the reset signal on the reset node and upon assertion of the enable/reset signal, the first logic circuit being configured to assert the target enable signal on the target enable node upon detecting a start condition or a stop condition before the count of the second counter reaches a second target number.

20. The non-transitory computer-readable storage medium of claim 19, wherein:

the idle state detection circuit includes a gating circuit having a gating activation node, the lineside bus clock input node, and a second gated bus clock node, the gating circuit being configured to gate a lineside bus clock signal on the lineside bus clock input node as a second gated bus clock signal on the second gated bus clock node, the gating circuit being configured to activate gating of the lineside bus clock signal based on assertion of a gating activation signal on the gating activation node; and the safe state detection circuit includes a flip-flop, an AND gate, an inverter, and a second logic circuit, an input node of the second logic circuit being electrically coupled to a count output node of the second counter, an output node of the second logic circuit being electrically coupled to an input node of the inverter, an output node of the inverter being electrically coupled to a first input node of the AND gate, an output node of the AND gate being electrically coupled to an input node of the flip-flop, an output node of the flip-flop being electrically coupled to an enable input node of the second counter, to a second input node of the AND gate, and the gating activation node of the gating circuit, a clock input node of the flip-flop being electrically coupled to the second gated bus clock node, a set input node of the flip-flop being electrically coupled to the output node of the idle state detection circuit, the second logic circuit being configured to assert a clear signal upon the count of the second counter output on the count output node reaching the second target number.

* * * * *